US008365112B2

United States Patent
Oishi et al.

(10) Patent No.: US 8,365,112 B2
(45) Date of Patent: Jan. 29, 2013

(54) VERIFICATION APPARATUS AND DESIGN VERIFICATION PROGRAM

(75) Inventors: Ryosuke Oishi, Kawasaki (JP); Praveen Kumar Murthy, Fremont, CA (US); Rafael Kazumiti Morizawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 292 days.

(21) Appl. No.: 12/702,576

(22) Filed: Feb. 9, 2010

(65) Prior Publication Data

US 2011/0061035 A1    Mar. 10, 2011

Related U.S. Application Data

(60) Provisional application No. 61/272,275, filed on Sep. 4, 2009.

(51) Int. Cl.
    G06F 17/50        (2006.01)
(52) U.S. Cl. .......................... 716/106; 716/111
(58) Field of Classification Search .................. 716/106, 716/111
    See application file for complete search history.

(56) References Cited

U.S. PATENT DOCUMENTS

| 7,275,231 B2 | 9/2007 | Murthy et al. |
| 2004/0073859 A1 | 4/2004 | Abe et al. |
| 2006/0059444 A1 | 3/2006 | Murthy et al. |
| 2008/0059952 A1* | 3/2008 | Van Huben et al. .......... 717/120 |

FOREIGN PATENT DOCUMENTS

| JP | 2001-113993 | 4/2001 |
| JP | 2001-222429 | 8/2001 |
| JP | 2004/185592 | 7/2004 |
| JP | 2006-085710 | 3/2006 |
| JP | 2007-257291 | 10/2007 |

OTHER PUBLICATIONS

Patent Abstracts of Japan, Publication No. 2006-085710, Published Mar. 30, 2006.
Patent Abstracts of Japan, Publication No. 2004-185592, Published Jul. 2, 2004.
Patent Abstracts of Japan, Publication No. 2007-257291, Published Oct. 4, 2007.
Patent Abstracts of Japan, Publication No. 2001-222429, Published Aug. 17, 2001.
Patent Abstracts of Japan, Publication No. 2001-113993, Published Apr. 24, 2001.

* cited by examiner

*Primary Examiner* — Vuthe Siek
(74) *Attorney, Agent, or Firm* — Staas & Halsey LLP

(57) ABSTRACT

In a design verification apparatus, a priority resolver selects one or more verification datasets for verifying a procedure described in a design specification of a target product, in response to a verification request for that procedure. The priority resolver determines a priority score of each parameter that the selected verification datasets specify as a constraint on the procedure. A verification order resolver determines a verification order of the selected verification datasets, based on the priority scores determined by the priority resolver. An output processor produces data identifying the verification datasets, together with indication of the determined verification order.

13 Claims, 38 Drawing Sheets

FIG. 11

Register: V
Type: Integer
Minimum Value: 0
Maximum Value: 137
(optional) Ideal Value: 14

25a  REGISTER BLOCK

Register: V2
Type: Floating Point
Minimum Value: -10
Maximum Value: 1.5
(optional) Ideal Value: NA 25b  REGISTER BLOCK Port: INT1
Type: [0:1]
Minimum Value: 0
Maximum Value: 3
(optional) Ideal Value: 0

26a  PORT BLOCK

Port: INT2
Type: Boolean
Minimum Value: 0
Maximum Value: 1
(optional) Ideal Value: NA 26b  PORT BLOCK

FIG. 12

27 DATA

```
<?xml version="1.0" encoding="UTF-8"?>
<specification version="0.2">
  <register name="register_table">
    <regref name="V" type="integer" min="0" max="137" ideal="14" />
    <regref name="V2" type="floating point" min="-10" max="1.5"
      ideal="NA" />
  <port name="port_table">
    <portref name="INT1" type="[0:1]" min="0" max="3" ideal="1" />
    <portref name="INT2" type="boolean" min="0" max="1" ideal="NA" />
  </port>
```

27a — regref V line
27b — regref V2 line
27c — portref INT1 line
27d — portref INT2 line

FIG. 24

60 DATA

```xml
<bmsc name="init" type="bmsc" />
  <bmsc name="Query" type="bmsc">
    <label name="Start ATM Trx; Done: Primary" />
    <label name="Start ATM Trx; Failed: Exceptional" />
    <instance name="user interface" isInteractor="true" />
    <instance name="ATM" />
    <instance name="database" />
    <message name="Insert Card Request" from="ATM" to="user"
      fromseq="1" toseq="1" />
    <message name="Insert Card" from="user" to="ATM"
      fromseq="3" toseq="3" />
    <message name="Enter PIN" from="user" to="ATM"
      fromseq="4" toseq="4" />
    <message name="V = Request Authentication" from="ATM"
      to="database" fromseq="5" toseq="5" />
  </bmsc>
  <bmsc name="Authentication Done" type="bmsc">
    <label name="Start ATM Trx; Done: Primary" />
    <instance name="user interface" isInteractor="true" />
    <instance name="ATM" />
    <instance name="database" />
    <message name="Display Menu" from="ATM" to="user"
      fromseq="2" toseq="2" />
    <message name="userDATA" from="database" to="ATM"
      fromseq="1" toseq="1" />
  </bmsc>
  <bmsc name="Authentication Failed" type="bmsc">
    <label name="Start ATM Trx; Failed: Exceptional" />
    <instance name="user interface" isInteractor="true" />
    <instance name="ATM" />
    <instance name="database" />
    <message name="Error Message" from="ATM" to="user"
      fromseq="4" toseq="4" />
    <message name="Error" from="database" to="ATM"
      fromseq="2" toseq="2" />
  </bmsc>
</specification>
```

61 { 61a { ... }
62 { 62a { ... }
63 { 63a { ... }

90 STATE DIAGRAM

91 STATE

92  STATE DIAGRAM

FIG. 32

110 DATA

```xml
<?xml version="1.0" encoding="UTF-8"?>
<specification version="0.1">
  <fsm name="Start ATM Trx FSM" type="FSM">
    <state name="init" type="init">
    <state name="St1" message="Insert Card Request">
      <label name="Start ATM Trx; Done: Primary" />
      <label name="Start ATM Trx; Failed: Exceptional" />
    </state>
    <state name="St2" message="Insert Card">
      <label name="Start ATM Trx; Done: Primary" />
      <label name="Start ATM Trx; Failed: Exceptional" />
    </state>
    <state name="St3" message="Enter PIN">
      <label name="Start ATM Trx; Done: Primary" />
      <label name="Start ATM Trx; Failed: Exceptional" />
    </state>
    <state name="St4" message="V = Request Authentication">
      <label name="Start ATM Trx; Done: Primary" />
      <label name="Start ATM Trx; Failed: Exceptional" />
    </state>
    <state name="St5" message="userdata">
      <label name="Start ATM Trx; Done: Primary" />
    </state>
    <state name="St6" message="Display Menu">
      <label name="Start ATM Trx; Done: Primary" />
    </state>
    <state name="St7" message="Error">
      <label name="Start ATM Trx; Failed: Exceptional" />
    </state>
    <state name="St8" message="Error Message">
      <label name="Start ATM Trx; Failed: Exceptional" />
    </state>
    <transition from="St1" to="St2" />
    <transition from="St2" to="St3" />
    <transition from="St3" to="St4" />
    <transition from="St4" to="St5" guardexpr="0<V<15" />
    <transition from="St4" to="St7" guardexpr="V=0, V≧15" />
    <transition from="St5" to="St6" />
    <transition from="St7" to="St8" />
  </fsm>
</specification>
```

110a: `<fsm name="Start ATM Trx FSM" ...>` block
111: St1 block
112: St2 block
113: St3 block
114: St4 block
115: St5 block
116: St6 block
117: St7 block
118: St8 block
119: transitions block

FIG. 34

VERIFICATION SCENARIO Sc1

```xml
<?xml version="1.0" encoding="UTF-8"?>
<specification version="0.1">
  <fsm name="Start ATM Trx FSM" type="scenario" priority="2">
    <state name="init" type="init">
    <state name="St1" message="Insert Card Request">
      <label name="Start ATM Trx; Done: Primary" />
      <label name="Start ATM Trx; Failed: Exceptional" />
    </state>
    <state name="St2" message="Insert Card">
      <label name="Start ATM Trx; Done: Primary" />
      <label name="Start ATM Trx; Failed: Exceptional" />
    </state>
    <state name="St3" message="Enter PIN">
      <label name="Start ATM Trx; Done: Primary" />
      <label name="Start ATM Trx; Failed: Exceptional" />
    </state>
    <state name="St4" message="V = Request Authentication">
      <label name="Start ATM Trx; Done: Primary" />
      <label name="Start ATM Trx; Failed: Exceptional" />
    </state>
    <state name="St5" message="userdata">
      <label name="Start ATM Trx; Done: Primary" />
    </state>
    <state name="St6" message="Display Menu">
      <label name="Start ATM Trx; Done: Primary" />
    </state>
    <transition from="St1" to="St2" />
    <transition from="St2" to="St3" />
    <transition from="St3" to="St4" />
    <transition from="St4" to="St5" guardexpr="0<V<15" />
    <transition from="St5" to="St6" />
  </fsm>
</specification>
```

FIG. 35

VERIFICATION SCENARIO Sc2

```xml
<?xml version="1.0" encoding="UTF-8"?>
<specification version="0.1">
 <fsm name="Start ATM Trx FSM" type="scenario" priority="1">
  <state name="init" type="init">
  <state name="St1" message="Insert Card Request">
    <label name="Start ATM Trx; Done: Primary" />
    <label name="Start ATM Trx; Failed: Exceptional" />
  </state>
  <state name="St2" message="Insert Card">
    <label name="Start ATM Trx; Done: Primary" />
    <label name="Start ATM Trx; Failed: Exceptional" />
  </state>
  <state name="St3" message="Enter PIN">
    <label name="Start ATM Trx; Done: Primary" />
    <label name="Start ATM Trx; Failed: Exceptional" />
  </state>
  <state name="St4" message="V = Request Authentication">
    <label name="Start ATM Trx; Done: Primary" />
    <label name="Start ATM Trx; Failed: Exceptional" />
  </state>
  <state name="St7" message="Error">
    <label name="Start ATM Trx; Failed: Exceptional" />
  </state>
  <state name="St8" message="Error Message">
    <label name="Start ATM Trx; Failed: Exceptional" />
  </state>
  <transition from="St1" to="St2" />
  <transition from="St2" to="St3" />
  <transition from="St3" to="St4" />
  <transition from="St4" to="St7" guardexpr="V=0, V≧"15 />
  <transition from="St7" to="St8" />
 </fsm>
</specification>
```

FIG. 38

19a PRIORITY RANKING LIST

| PRIORITY RANKING | SCENARIO | VERIFICATION SCENARIO | PARAMETER NAME | PARAMETER VALUE | OVERALL PRIORITY SCORE |
|---|---|---|---|---|---|
| 1 | Scenario "Failed" | Sc2 | V, INT1 | V=137, INT1=2 | 18 |
| 1 | Scenario "Failed" | Sc2 | V, INT1 | V=0, INT1=2 | 18 |
| 3 | Scenario "Done" | Sc1 | V, INT1 | V=14, INT1=0 | 13 |

VERIFICATION APPARATUS AND DESIGN VERIFICATION PROGRAM

CROSS-REFERENCE TO RELATED APPLICATION(S)

This application is based upon and claims the benefit of priority of U.S. Provisional Application No. 61/272,275, filed on Sep. 4, 2009, the entire contents of which are incorporated herein by reference.

FIELD

The embodiments discussed herein relate to an apparatus and a program for performing design verification.

BACKGROUND

Recent advancement of design technologies has enabled development of increasingly large-scale software and hardware products. To pursue the design process while ensuring that the product under development will work as it is intended, the stage of design and development involves design verification. This verification task is becoming more and more part of a development process because of the increasing scale of target products as noted above. The deadline of a development project, on the other hand, may sometimes be moved up, and the actual number of man-hours may exceed the estimation. For those reasons, it is not unusual for the project to encounter the problem of insufficient time for development.

In view of the above, several techniques are proposed to improve the efficiency of verification tasks. For example, the following documents describe several techniques directed to extraction of test items for a specific verification step to reduce the time required for design and development.

U.S. Pat. No. 7,275,231
Japanese Laid-open Patent Publication No. 2006-85710
Japanese Laid-open Patent Publication No. 2004-185592
Japanese Laid-open Patent Publication No. 2007-257291

The extracted test items are then subjected to a verification process. However, testing them in a random order is not efficient at all because, if a desired test was placed in a later part of the verification process, it would take a long time for the user to receive an error report from that test. While the verification process includes a significant number of test steps, the scheduling of those steps depends on the expertise of users (i.e., design engineers and test engineers). They choose an appropriate verification procedure to prioritize their desired tests. Inexperienced engineers, however, lack this expertise for efficient verification, thus failing to choose a correct sequence of test steps.

SUMMARY

According to an aspect of the invention, there is provided a design verification apparatus including the following elements: a priority resolver, responsive to a verification request for a procedure described in a design specification of a target product, to select one or more verification datasets for verifying the procedure and determine a priority score of each parameter that the selected verification datasets specify as a constraint on the procedure; a verification order resolver to determine a verification order of the selected verification datasets, based on the priority scores determined by the priority resolver; and an output processor to produce data identifying the verification datasets, together with indication of the determined verification order.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

FIG. 11 illustrates parameters;

FIG. 12 illustrates a data structure of the parameters of FIG. 11;

Figure 21:
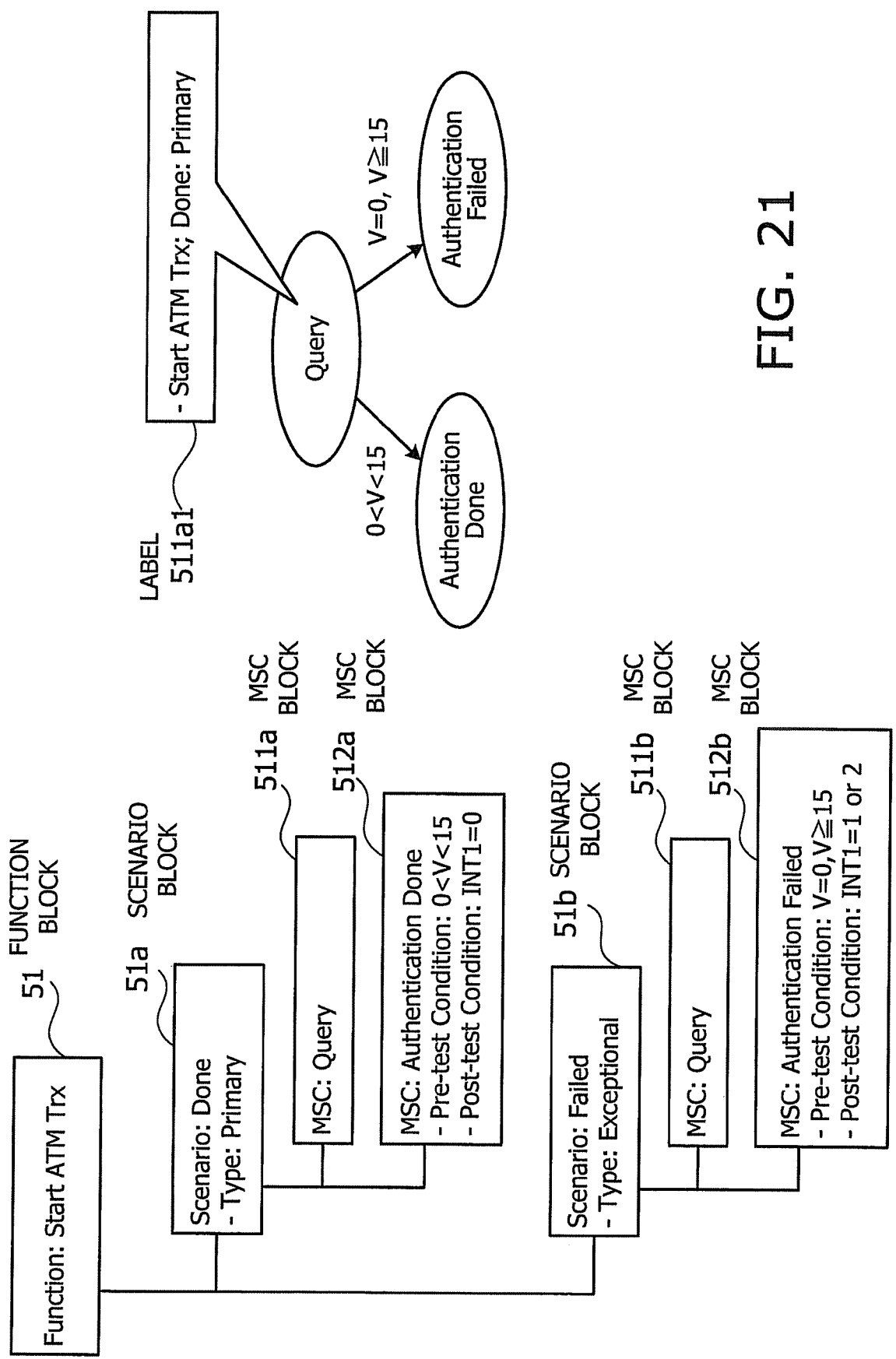
Figure 22:
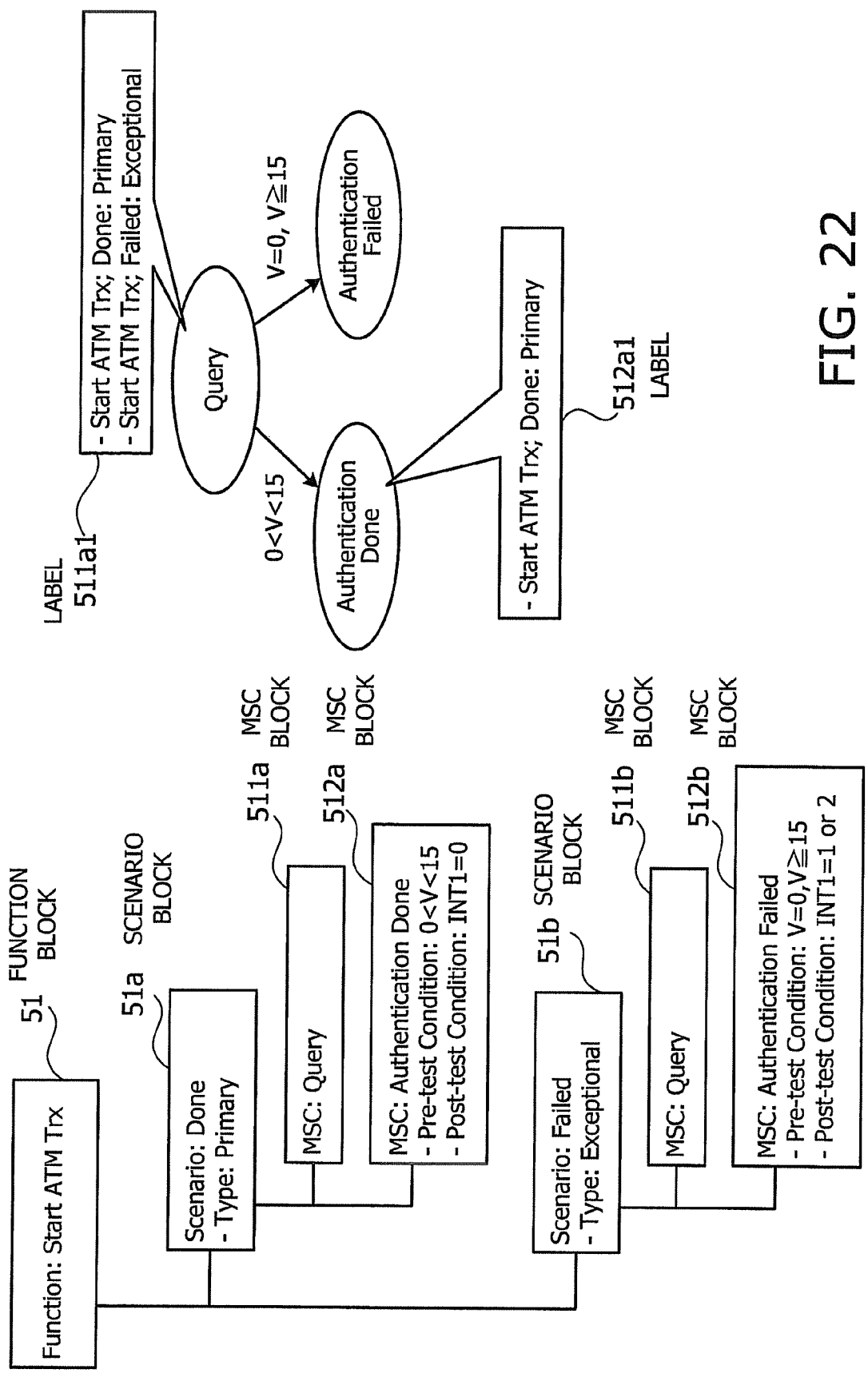
Figure 23:
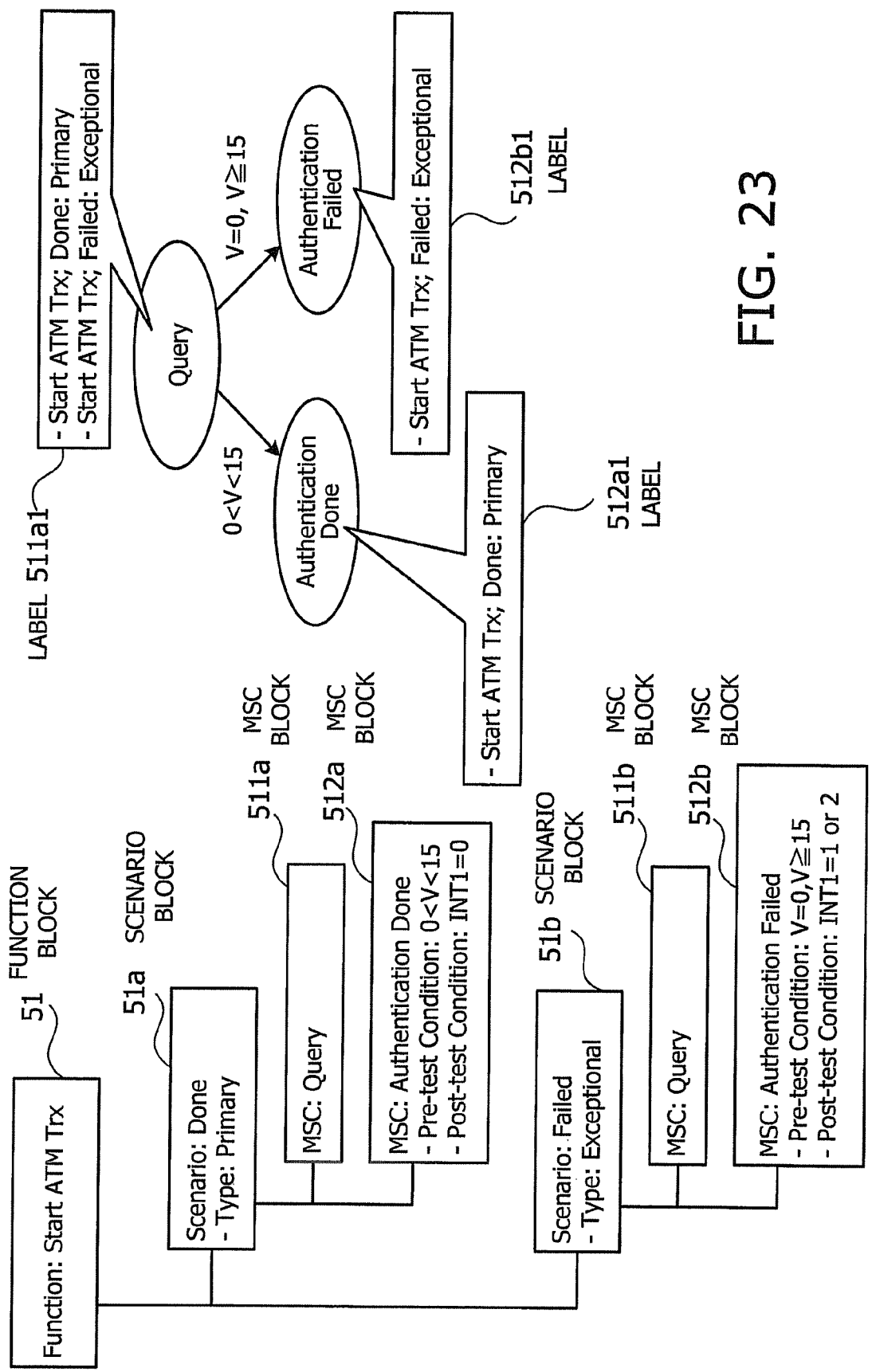
Figure 25:
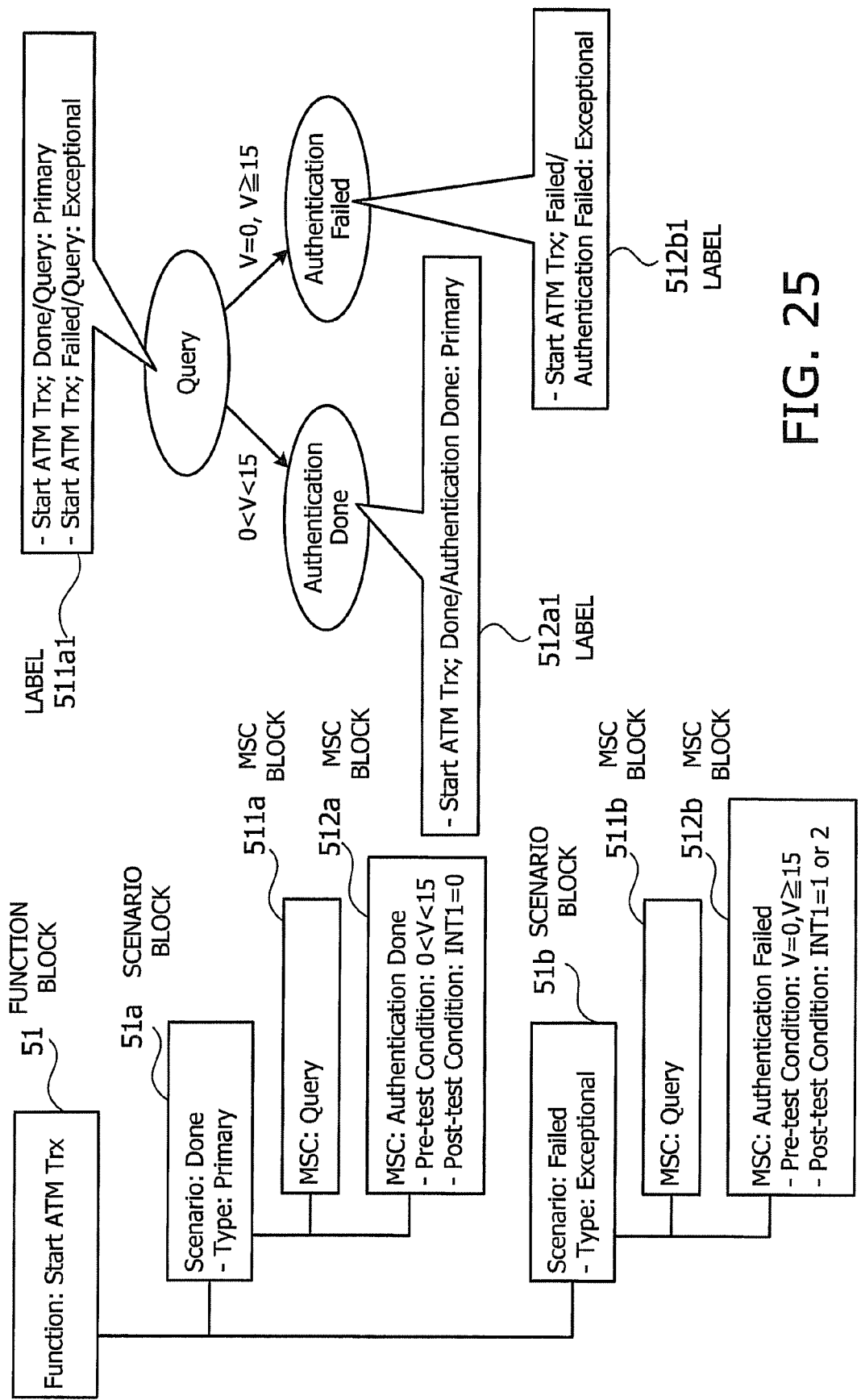
Figure 26:
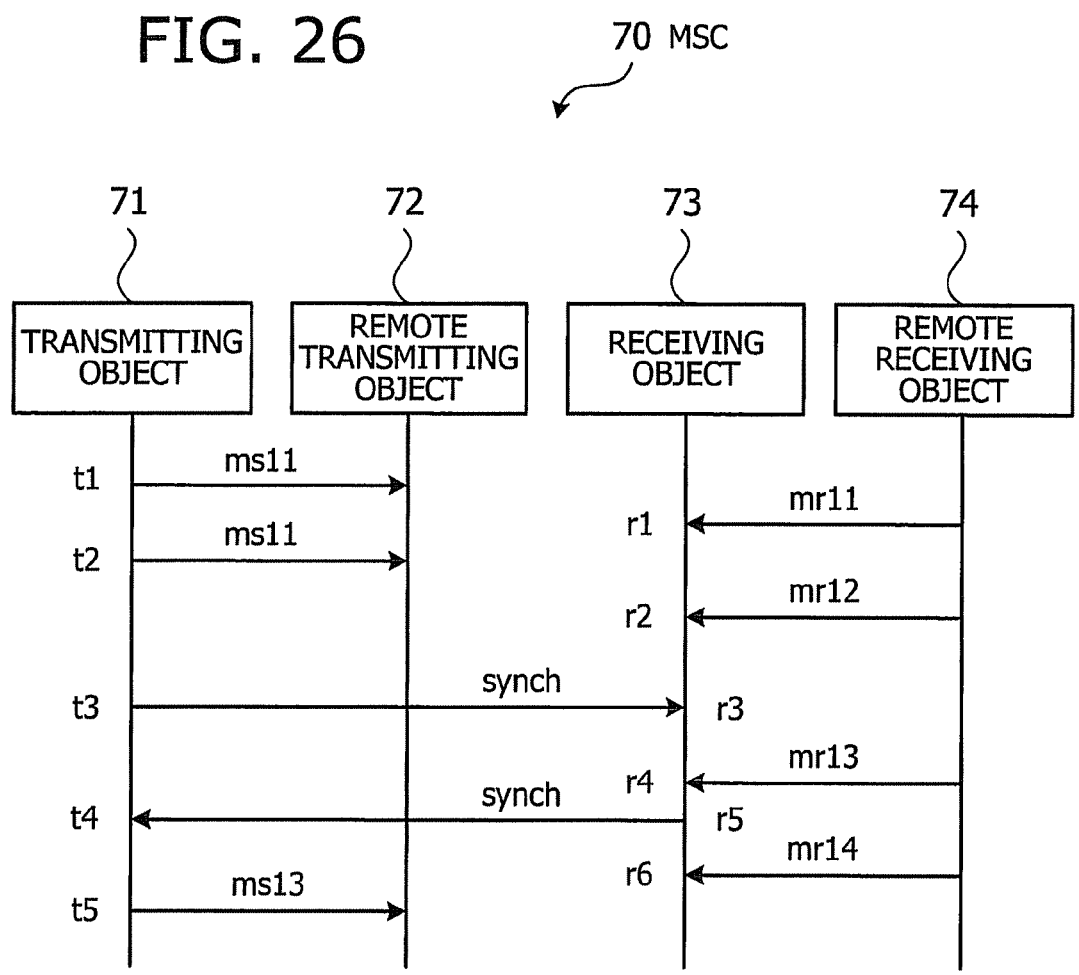
Figure 27:
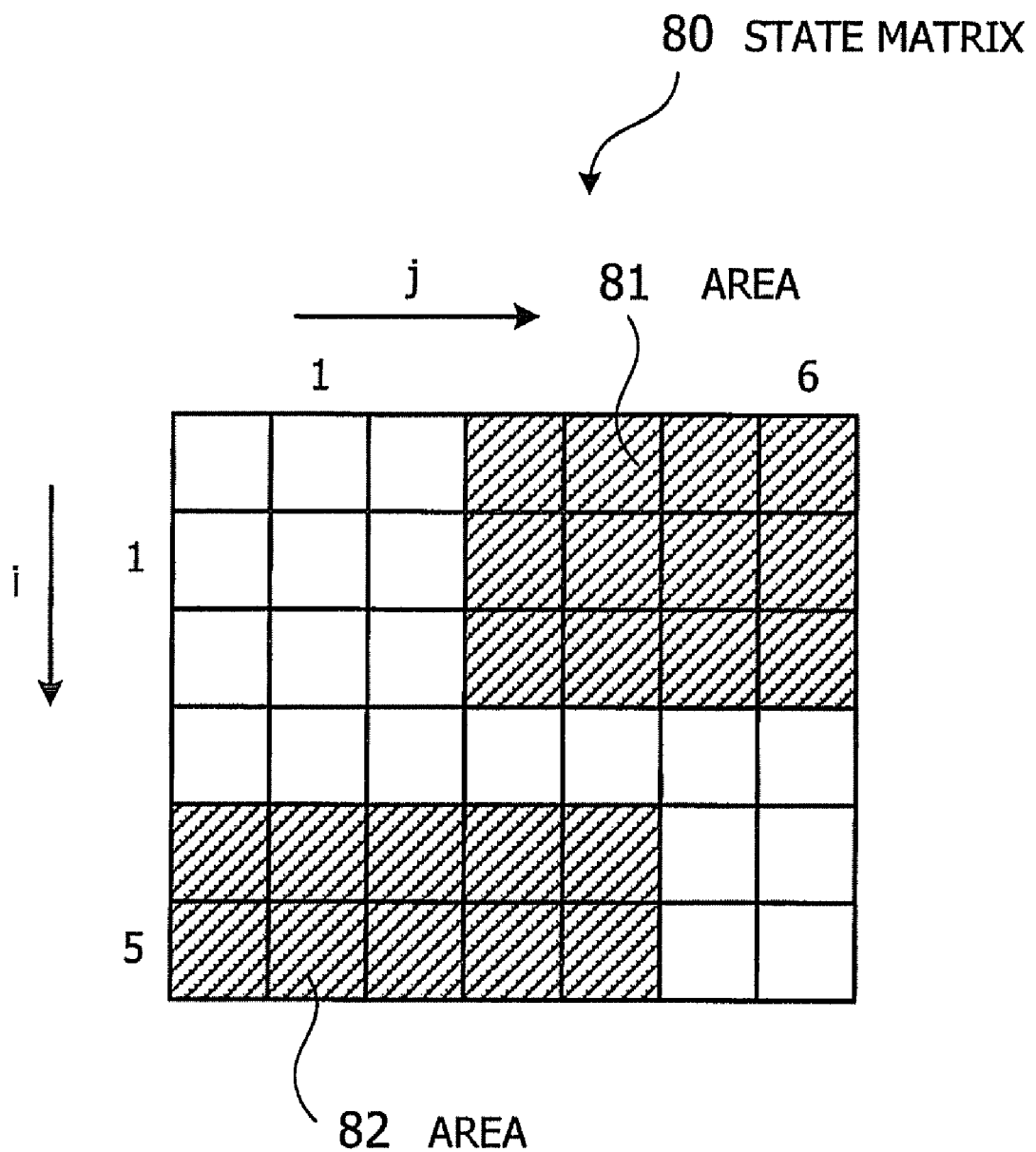
Figure 28:
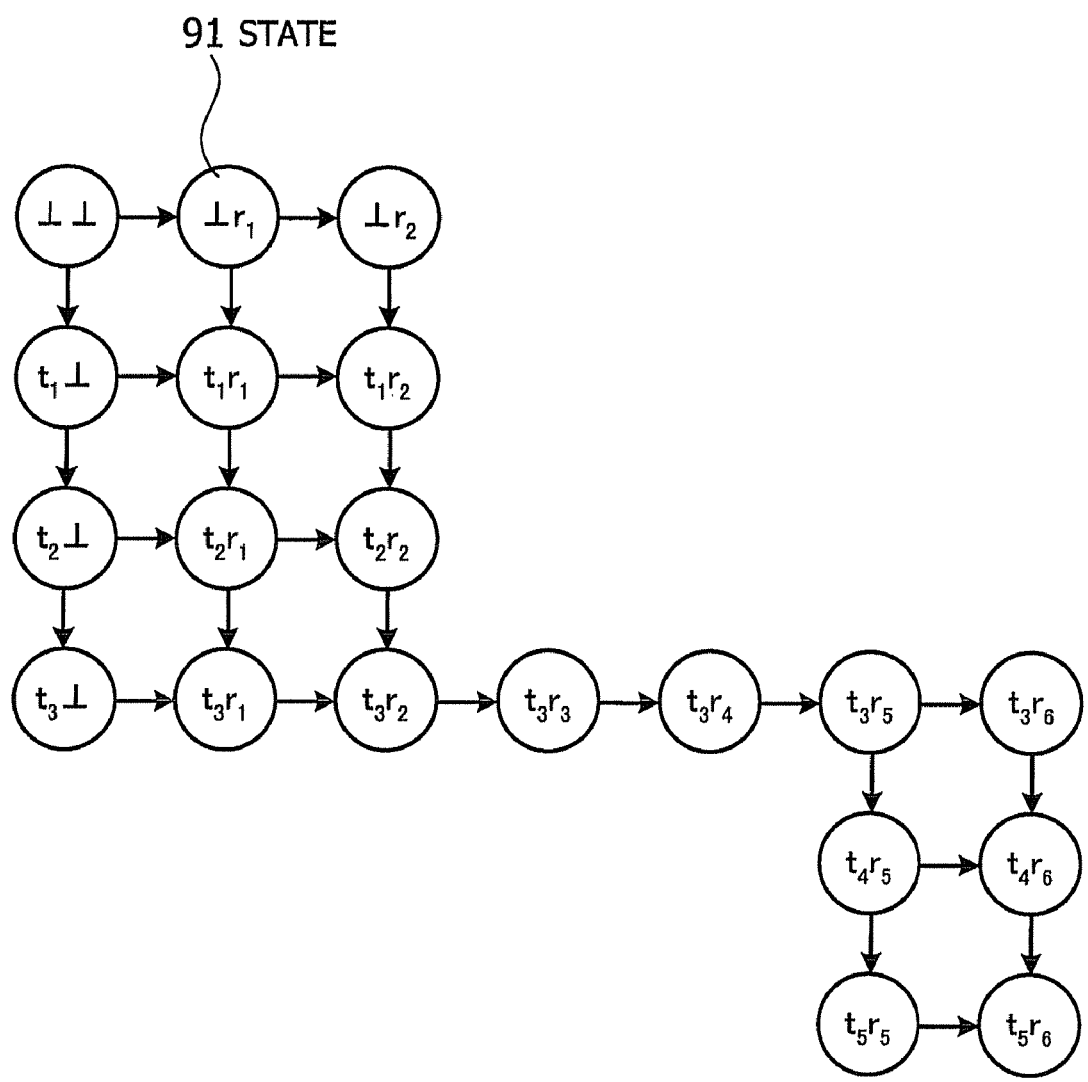
Figure 29:
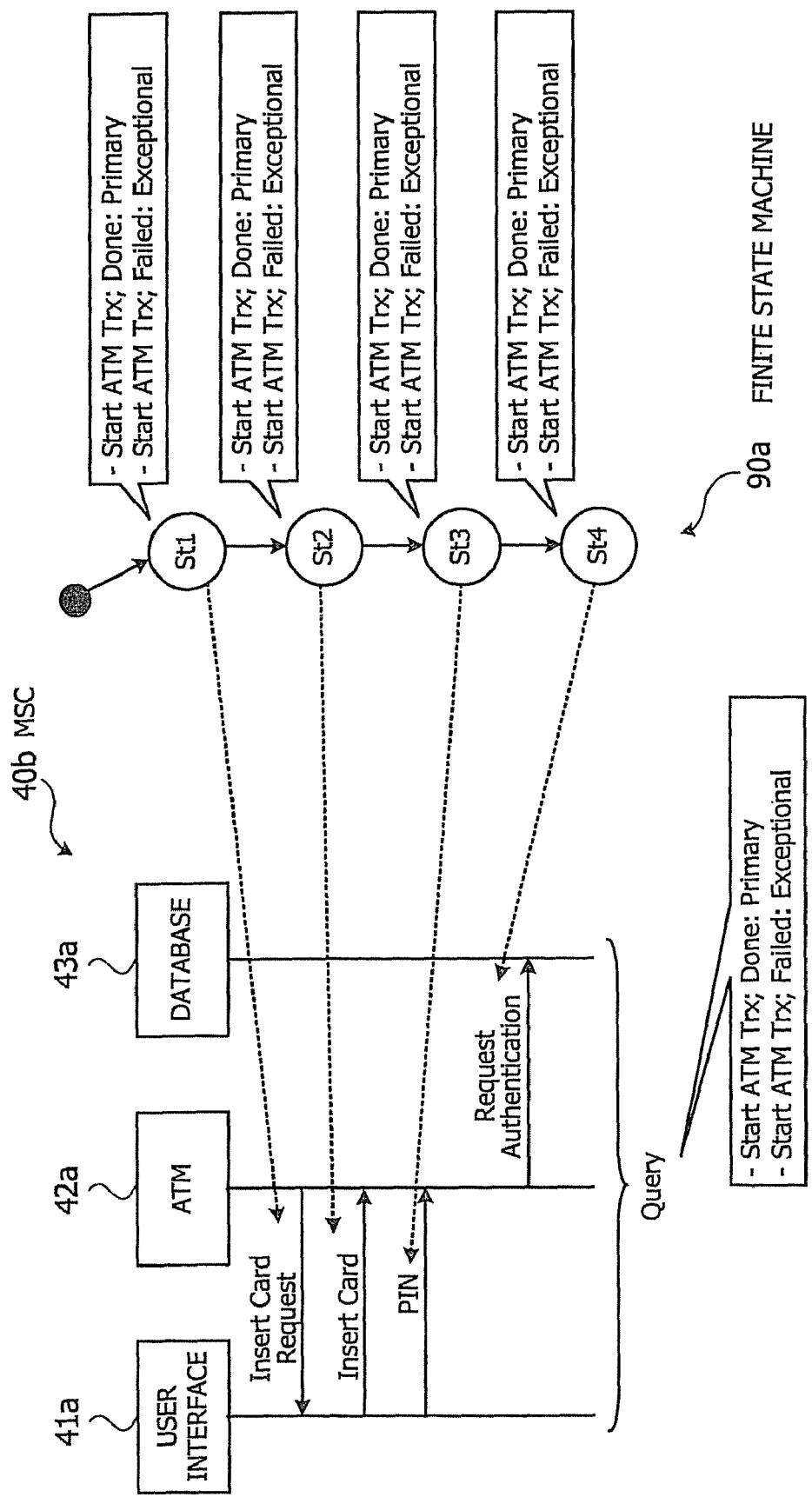
Figure 30:
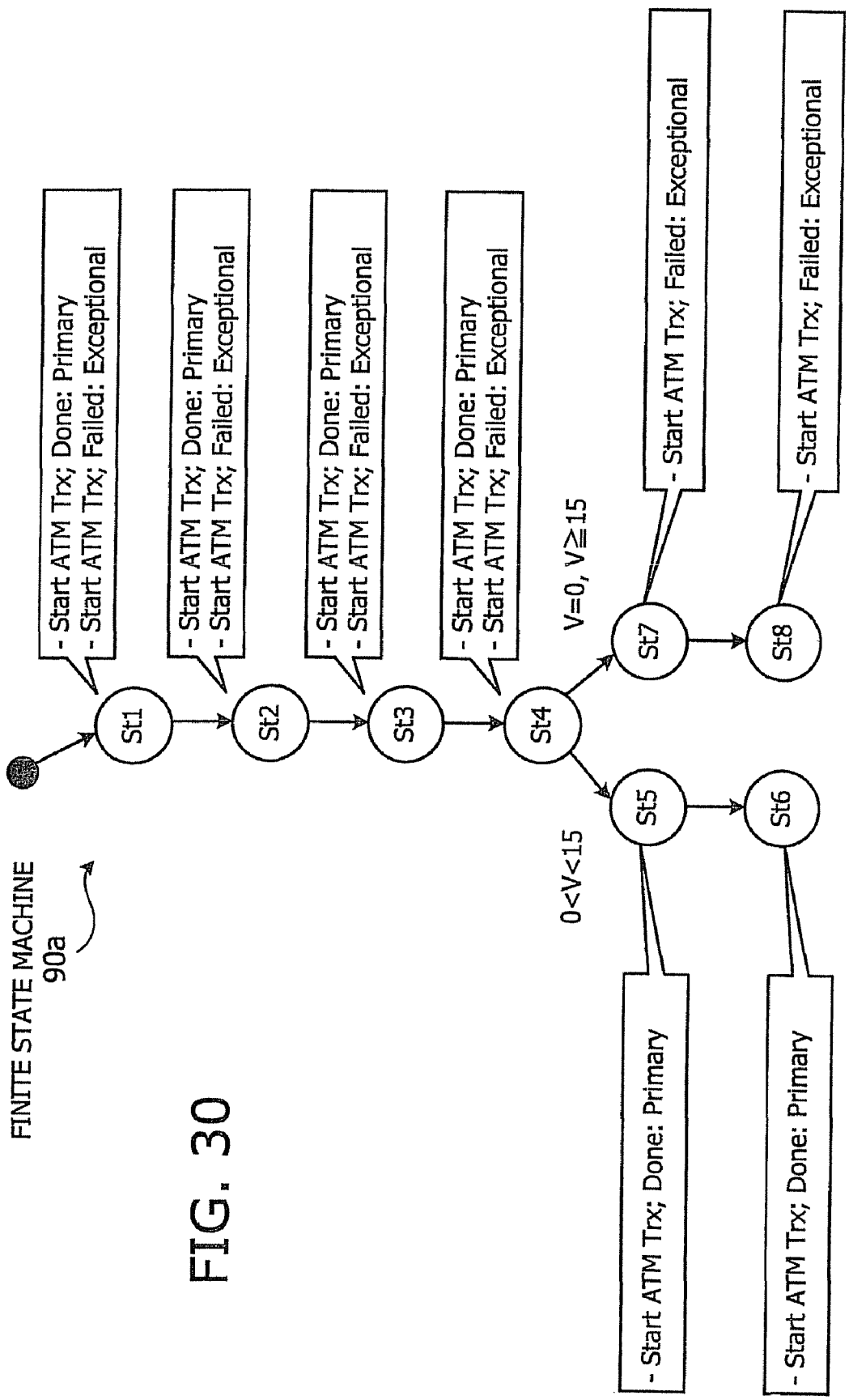
Figure 31:
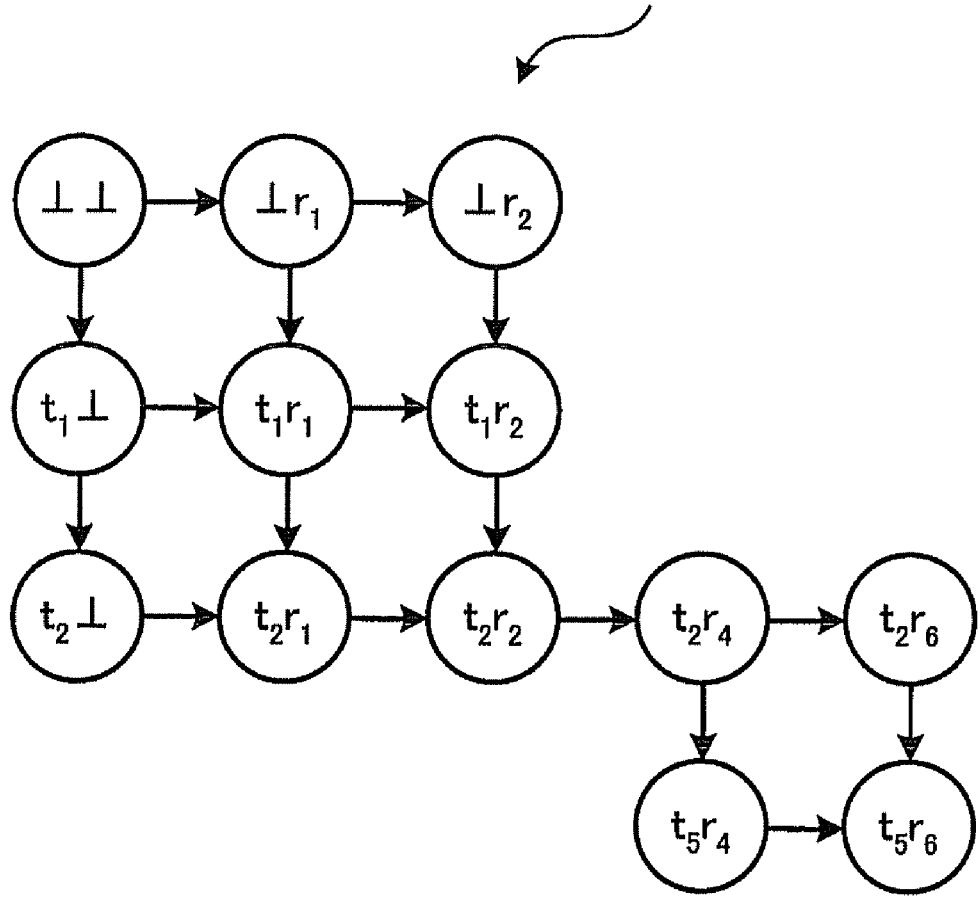
Figure 33:
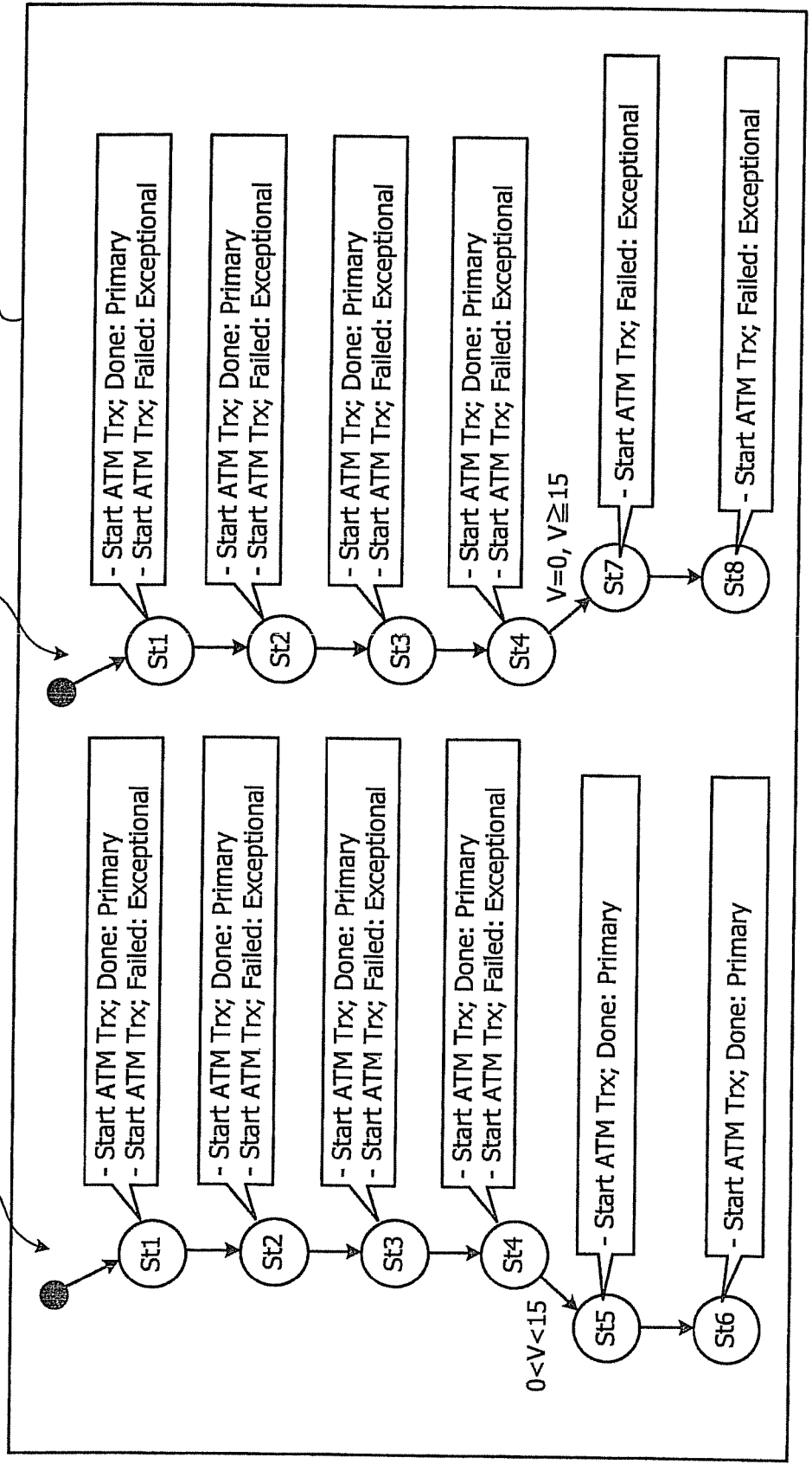
Figure 36:
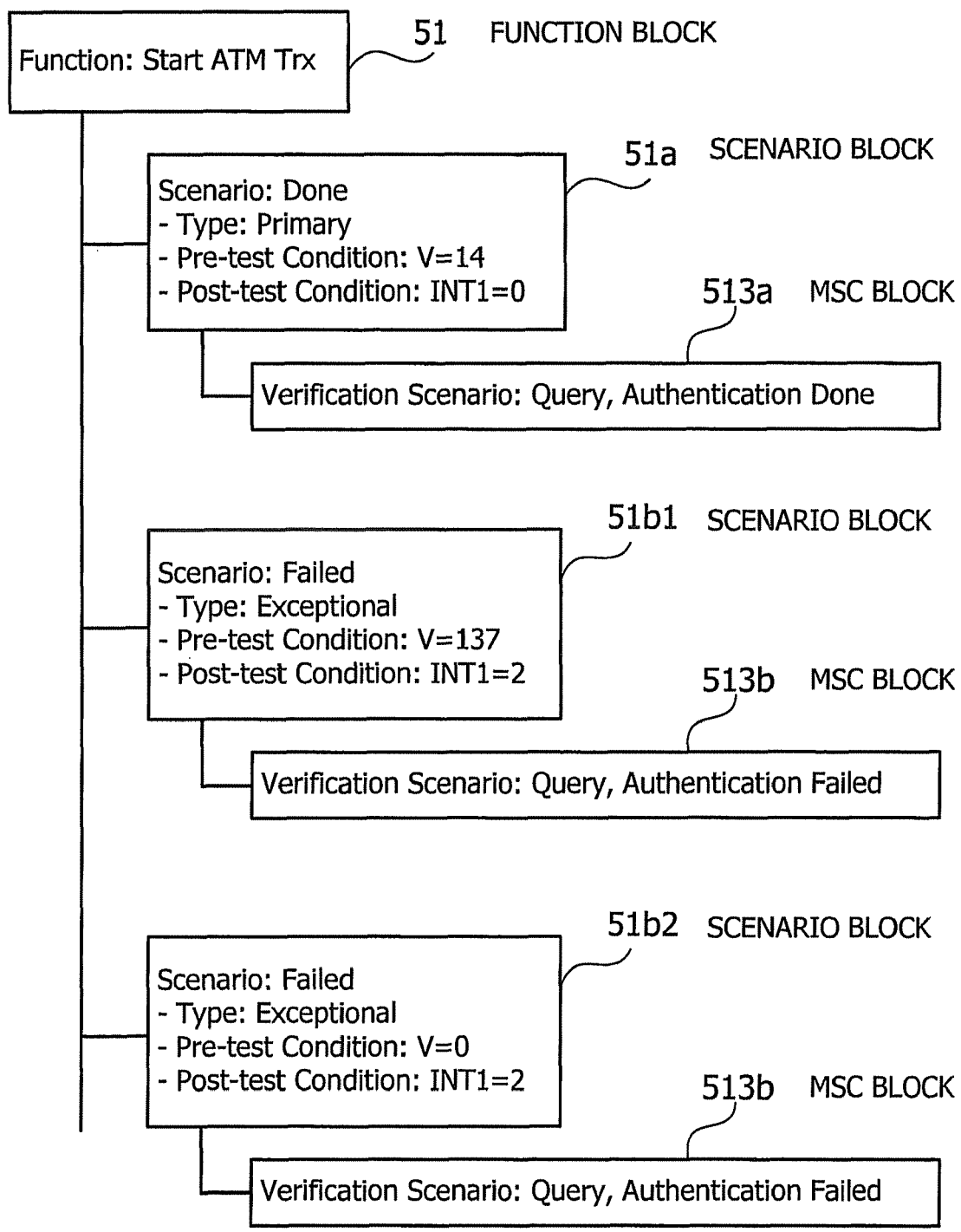
Figure 37:
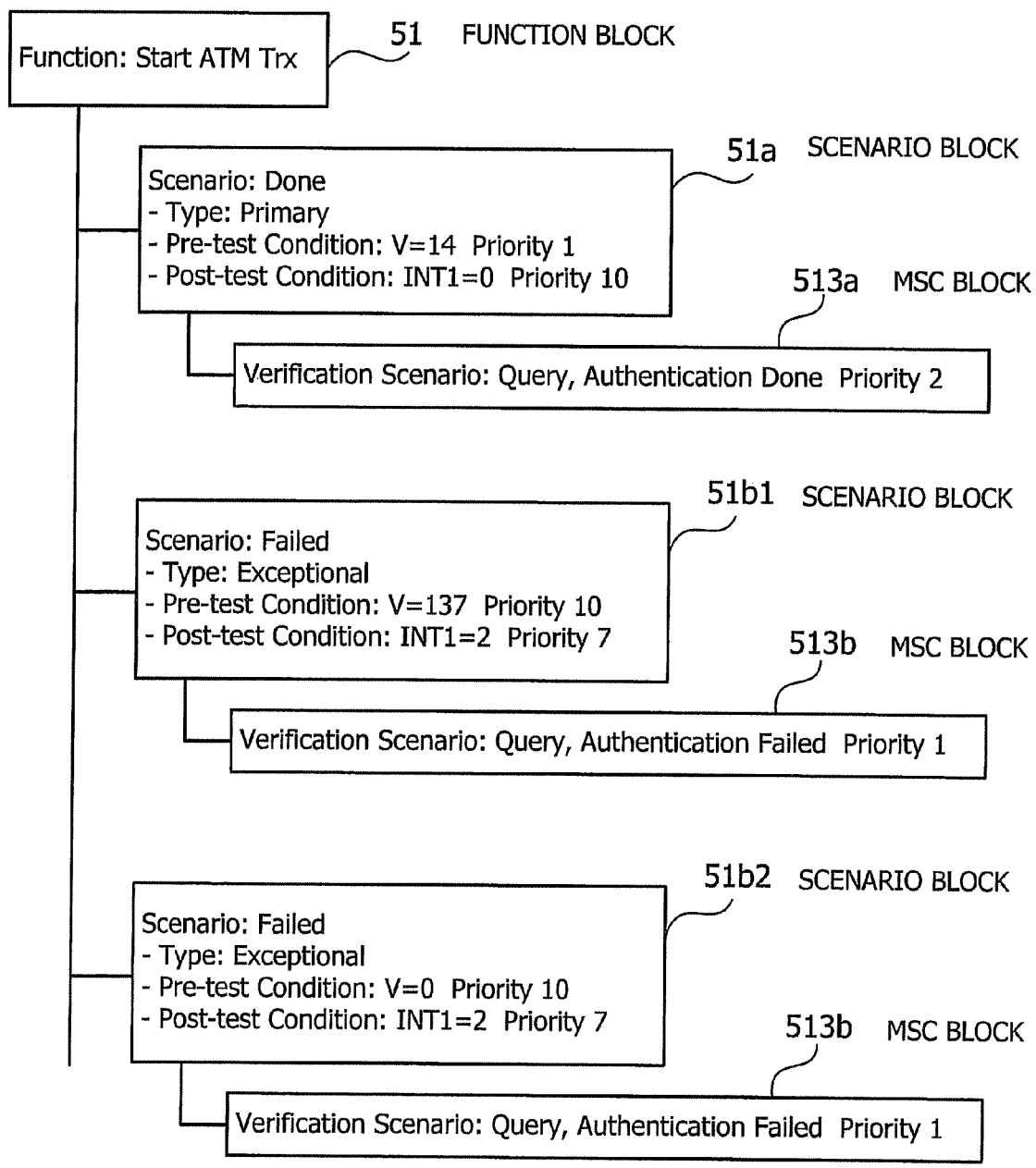

FIGS. 21 to 23 give several specific examples of labeled LSI design specifications;

FIG. 24 illustrates an example data structure of a labeled LSI design specification;

FIG. 25 gives another example of a labeled LSI design specification;

FIG. 26 is a message sequence chart illustrating a conversion process to produce a finite state machine;

FIG. 27 illustrates a state matrix corresponding to the message sequence chart of FIG. 26;

FIG. 28 is a state diagram corresponding to a state matrix;

FIG. 29 illustrates a specific example of how labels are added to a finite state machine;

FIG. 30 depicts a final view of a labeled finite state machine;

FIG. 31 is a state diagram corresponding to a state matrix;

FIG. 32 illustrates an example data structure of a finite state machine;

FIG. 33 illustrates verification scenarios stored in the verification scenario database 12;

FIGS. 34 and 35 illustrate a data structure of prioritized verification scenarios;

FIGS. 36 and 37 illustrate an example of a parameter priority setting process; and FIG. 38 illustrates an example of a priority ranking list.

DESCRIPTION OF EMBODIMENT(S)

Preferred embodiments of the present invention will be described below with reference to the accompanying drawings, wherein like reference numerals refer to like elements throughout. The following description begins with an overview of a design verification apparatus according to a first embodiment and then proceeds to more specific embodiments of the invention.

First Embodiment

Figure 1:
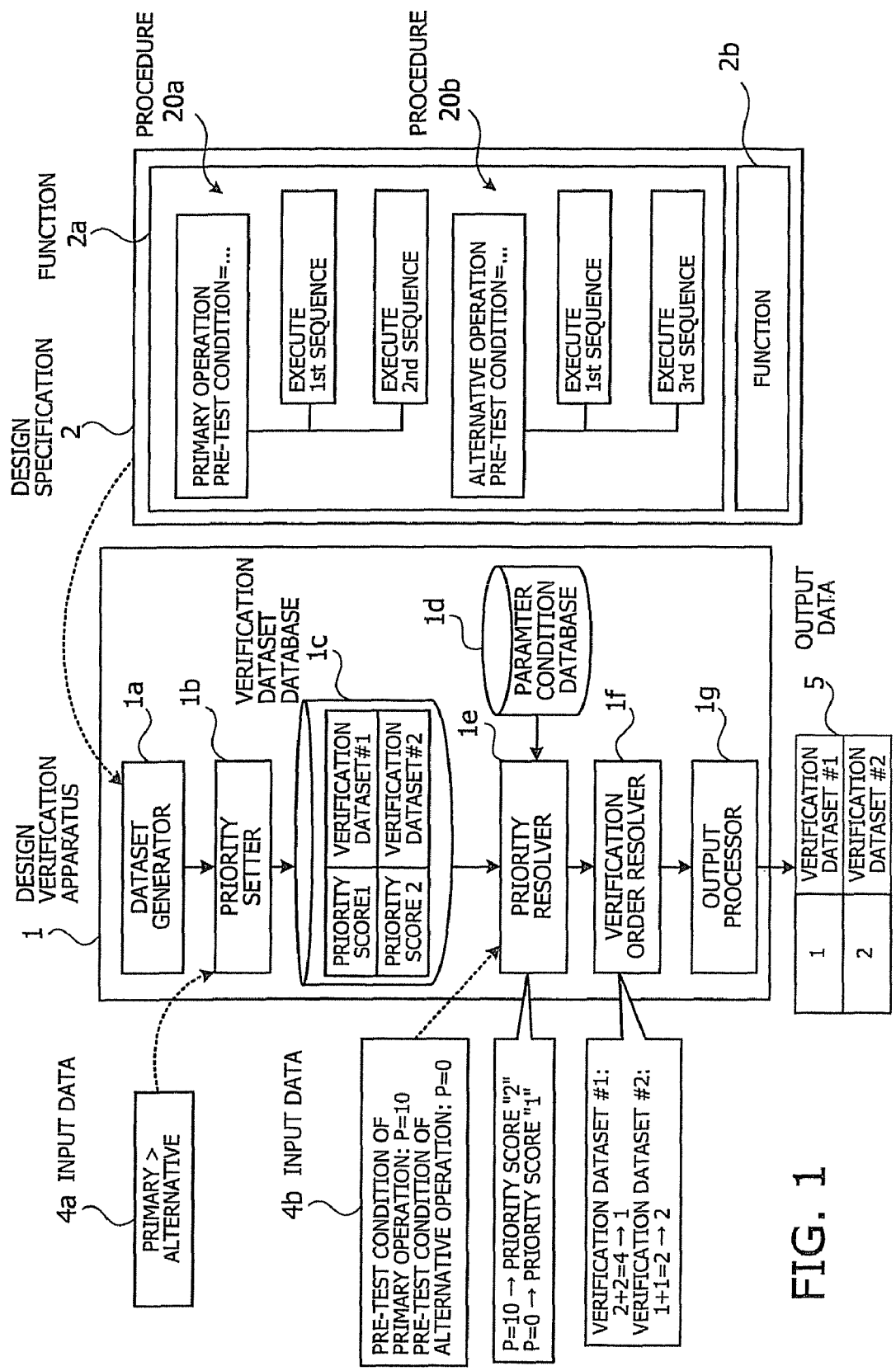
FIGS. 1 and 2 illustrate a design verification apparatus according to a first embodiment.
Figure 2:
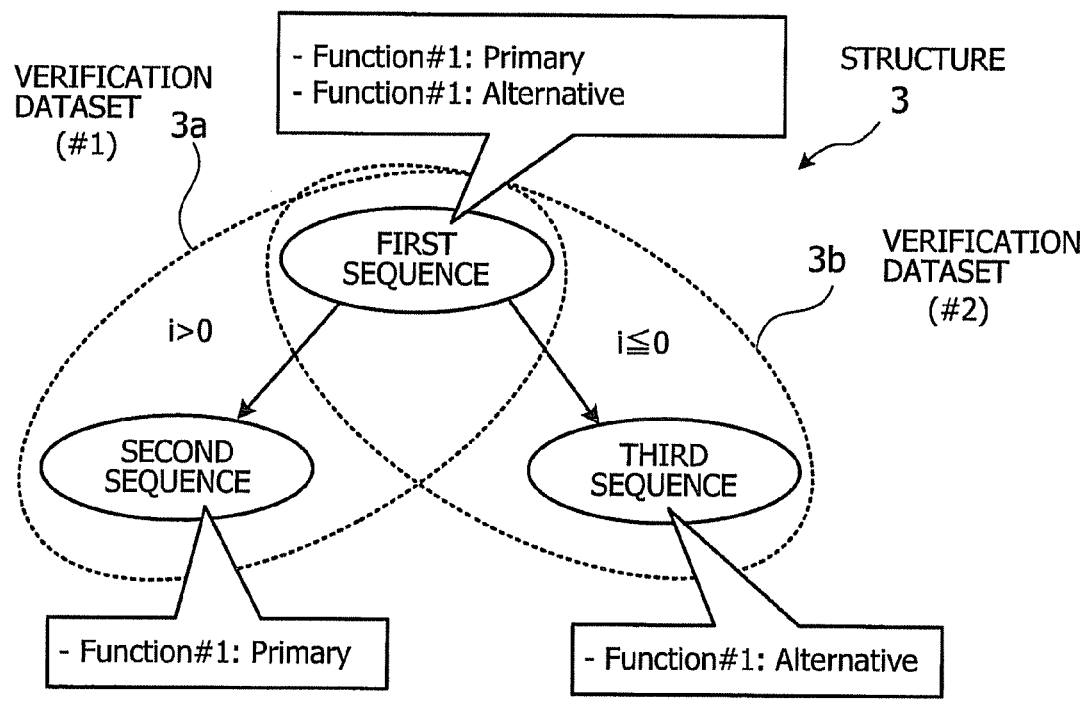

FIGS. 1 and 2 illustrate a design verification apparatus according to a first embodiment. This design verification apparatus 1 includes a dataset generator 1a, a priority setter 1b, a parameter condition database 1d, a priority resolver 1e, a verification order resolver 1f, and an output processor 1g.

The dataset generator 1a generates verification datasets which associate each unit process of a plurality of procedures (or processing scenarios) described in a design specification of a target product with an identifier (or label) designating which portion of the design specification is to be verified. The generated verification datasets are used to verify a specific procedure (e.g., whether the procedure works as it is intended). Here the term "target product" refers to a specific object to be tested and verified by the design verification apparatus 1, which may be, for example, hardware components, software modules, or a system thereof. The design specification of a target product describes what its implementation should comply with. A design specification is formed from at least one function.

Also illustrated in FIG. 1 is a design specification 2 including two functions 2a and 2b. The function 2a is realized by two constituent procedures 20a and 20b. The former procedure 20a defines a primary operation of the function 2a, while the latter procedure 20b defines an alternative operation which may execute in place of the primary operation.

Those procedures 20a and 20b may each include one or more definitions of pre-test condition, post-test condition, and invariant condition as their execution constraints. Specifically, pre-test conditions are what have to be satisfied (i.e., conditions that return a value of "true" when tested) before starting a defined series of operations to execute a function. Post-test conditions are what have to be satisfied when such a series of operations is completed. Invariant conditions are what are required until the post-test conditions become true (i.e., during the course of the series of operations). As an example of such conditions, FIG. 1 illustrates pre-test conditions for primary and alternative operations.

The illustrated procedure 20a has a branch structure in which the nodes represent unit processes of the primary operation. Those unit processes may include, for example, one or more message sequence charts to define interactions between objects involved in the function 2a. For details of message sequence chart, see U.S. Pat. No. 7,275,231 and Japanese Laid-open Patent Publication No. 2006-85710.

The relationships between two procedures 20a and 20b are defined by a structure 3 depicted in FIG. 2. This structure 3 represents the design specification 2 in a compact way, in which first to third sequences are associated by branches and merges that indicate their relationships. The arrows connecting those sequence blocks indicate in what order the described functions are executed. Specifically, the procedure 20a executes the first sequence and second sequence in that order, and the procedure 50b executes the first sequence and third sequence in that order. That is, the illustrated structure 3 indicates that those two procedures operate in the same way up to the first sequence, but will then be diverted into different operations.

The edges of this structure 3 are directional edges each having a specific guard condition. Those guard conditions describe under what conditions a transition from one sequence to another sequence occurs. For example, FIG. 2 illustrates two guard conditions, i.e., i>0 and i<=0. Specifically, the process is allowed to proceed from the first sequence to the second sequence if i>0 when the first sequence is finished. The process may instead go to the third sequence if i<=0 at that time.

For the function 2a illustrated in FIG. 1, the dataset generator 1a produces verification datasets which associate each of the first and second sequences of the procedure 20a of primary operation with identifiers designating which portion of the given design specification is to be verified. What is verified in this case is a function, procedure, or unit process of the given design specification. In the example of FIG. 2, the first and second sequences are both associated with an identifier "Function#1" representing the function 2a and another identifier "Primary" (primary operation) representing the procedure 20a.

The dataset generator 1a also produces verification datasets for another procedure 20b describing alternative operation of the function 2a, so as to associate each of the first and third sequences with portions of the given design specification. In the example of FIG. 2, the first and third sequences are both associated with an identifier "Function#1" representing the function 2b and another identifier "Alternative" (alternative operation) representing the procedure 20b.

As a result of the above processing by the dataset generator 1a, the first sequence has gained two lines of identifiers, "Function#1: Primary" and "Function#1: Alternative." The second sequence has gained a single line of identifiers "Function#1: Primary." Likewise, the third sequence has gained a single line of identifiers "Function#1: Alternative."

The dataset generator 1a then identifies sequences sharing a particular identifier and extracts each such set of sequences as a verification dataset. In the present example of FIG. 2, the first and second sequences constitute one verification dataset 3a for "Primary" operation. In other words, this verification dataset 3a provides information for testing the primary operation of the function 2a. Likewise, the first and third sequences constitute another verification dataset 3b for "Alternative" operation. In other words, this verification dataset 3b provides information for testing the alternative operation of the function 2a.

Referring back to FIG. 1, the priority setter 1b assigns a process priority to each produced verification dataset 3a and 3b according to input data 4a. Suppose, for example, that the input data 4a specifies "Primary>Alternative" as illustrated in FIG. 1. Assuming in this case that primary operation is supposed to have a higher process priority than alternative operation, the priority setter 1b assigns a priority score of 2 to the verification dataset 3a in preference to the other verification dataset 3b, which is given a priority score of 1.

According to the present embodiment, the resulting prioritized verification datasets are saved as records of a verification dataset database 1c. In the example illustrated in FIG. 1, one such record indicates verification dataset #1 (verification dataset 3a in FIG. 2) with a priority score of 2, and another record indicates verification dataset #2 (verification dataset 3b in FIG. 2) with a priority score of 1.

The priority resolver 1e selects at least one of those verification datasets #1 and #2 stored in the verification dataset database 1c, according to given input data 4b. The selected verification dataset contains several parameters specifying constraints. The priority resolver 1e determines a priority score of each parameter specified in the input data 4b.

In the case, for example, where a procedure is provided in the form of a function, this procedure can be executed by entering input values (or arguments) to the function. The term "parameters" refers to such input values. Suppose, for example, that the input data 4b specifies "P=10" as a pre-test condition of primary operation and "P=0" as that of alternative operation, as illustrated in FIG. 1. The priority resolver 1e then selects a verification dataset 3a to verify the primary operation according to the pre-test condition with a parameter value of P=10.

In this context, the parameter condition database 1d stores predefined conditions or rules as to how to determine priority scores of given parameters. For example, it is previously established that parameter P be given a priority score of 2 when its value is 10 (i.e., P=10). Accordingly, the priority resolver 1e assigns a priority score of 2 to the pre-test condition of the verification dataset 3a.

Similarly to the above, the priority resolver 1e selects another verification dataset 3b to verify the alternative operation according to the pre-test condition with a parameter value of P=0. A predefined record in the parameter condition database 1d sets a rule that a priority score of 1 be given to parameter P when its value is zero (i.e., P=0). Accordingly, the priority resolver 1e assigns a priority score of 1 to the pre-test condition of the verification dataset 3b.

The verification order resolver 1f determines a verification order of the selected verification datasets 3a and 3b (i.e., in what order those verification datasets will be subjected to the verification), based on the priorities determined by the priority resolver 1e. Various methods may be used here to determine the verification order. For example, one method begins with adding, for each verification dataset 3a and 3b, the priority scores assigned or determined by the priority setter 1b and priority resolver 1e. The resulting sums are then compared with each other, and the verification datasets are sorted in descending order of their respective sums.

In the above example of FIGS. 1 and 2, one verification dataset 3a has two priority scores, 2 and 2, the former being assigned by the priority setter 1b and the latter being determined by the priority resolver 1e. The verification order resolver 1f adds these values together, thus obtaining a sum of 4. The other verification dataset 3b also has two priority scores, 1 and 1, the former being assigned by the priority setter 1b and the latter being determined by the priority resolver 1e. The verification order resolver 1f adds these values together, thus obtaining a sum of 2. The verification order resolver 1f takes the former verification dataset 3a in preference to the latter verification dataset 3b since the former has a larger sum of priority scores than the latter.

Another method applicable to the verification order resolver 1f is to multiply the two priority scores together for each verification dataset 3a and 3b and sort these verification datasets 3a and 3b in descending order of the resulting products. Yet another method is to use a predetermined function to evaluate priority scores and sort the verification datasets according to the return values of that function.

The output processor 1g produces output data identifying the verification datasets 3a and 3b selected by the priority resolver 1e, together with an indication of their verification order. In the example of FIG. 1, the output processor 1g produces output data 5 formed from two records. One record indicates verification dataset #1 (verification dataset 3a in FIG. 2) with a priority score of 1, and the other record indicates verification dataset #2 (verification dataset 3b in FIG. 2) with a priority score of 2.

According to the above-described design verification apparatus 1, the dataset generator 1a is configured to produce verification datasets 3a and 3b, and the priority setter 1b is configured to assign a priority score to each produced verification dataset according to given input data 4a that specifies which portions of a given design specification are to be verified and what their process priorities are. These features help the user to determine which portions to verify in what priorities.

In addition to the above, the present embodiment provides a priority resolver 1e to determine priority scores of parameters according to given input data 4b including parameters specified in each constraint on the procedure. The present embodiment provides a verification order resolver 1f to determine the verification order of each verification dataset 3a and 3b based on the priorities assigned and determined by the priority setter 1b and priority resolver 1e. These features help the user to verify the target product in a more efficient manner by using verification datasets in the determined order.

While the design verification apparatus 1 of the present embodiment contains a dataset generator 1a and a priority setter 1b to produce prioritized verification datasets, the invention is not limited by this specific embodiment. For example, the design verification apparatus 1 may also be configured to receive verification datasets that have been produced and prioritized by some other devices, so that the priority resolver 1e can determine priority scores of those verification dataset based on parameter conditions stored in the parameter condition database 1d. The design verification apparatus 1 in this case may omit the functions of the foregoing dataset generator 1a and priority setter 1b. The following sections will now describe a more specific embodiment of the invention.

Second Embodiment

Figure 3:
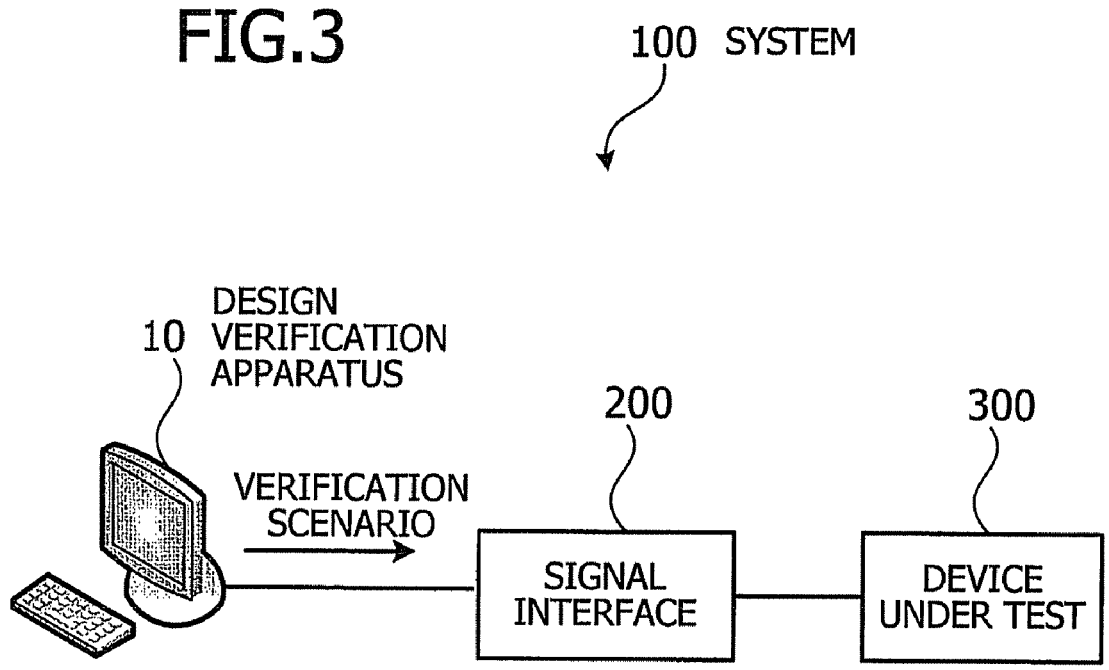
FIG. 3 is a block diagram illustrating a system according to a second embodiment.

FIG. 3 is a block diagram illustrating a system according to a second embodiment. The illustrated system 100 involves a design verification apparatus 10, a signal interface 200, and a device 300 under test. The design verification apparatus 10 is used to test whether the device 300 under test will operate as specified in its design specification. To this end, the design verification apparatus 10 produces a verification scenario for each processing scenario described in the design specification. The design verification apparatus 10 then assigns priorities to the produced verification scenarios. The design verification apparatus 10 further interacts with the device 300 under test via the signal interface 200 so as to test whether the device 300 under test can operate in accordance with those prioritized verification scenarios. In this test process, the priority scores of verification scenarios are used to determine in what order those scenarios should be applied to the device 300 under test.

The signal interface 200 is a device that permits the design verification apparatus 10 to communicate with the device 300 under test by converting their signals into each other's form. This signal interface 200 may be omitted in the case where, for example, the design verification apparatus 10 and device 300 under test are compatible in their signal specifications.

The device 300 under test is what will be tested and verified by the design verification apparatus 10. For example, hardware components, software modules, or a system containing them are subjected to the design verification apparatus 10.

The device 300 may be a physical device such as a product prototype manufactured in the course of product development, or a logical simulation model such as a state machine created on the design verification apparatus 10. The following description assumes that a large-scale integration (LSI) circuit is under development and thus subjected to the verification.

(a) Design Specification of LSI Chip

Figure 4:
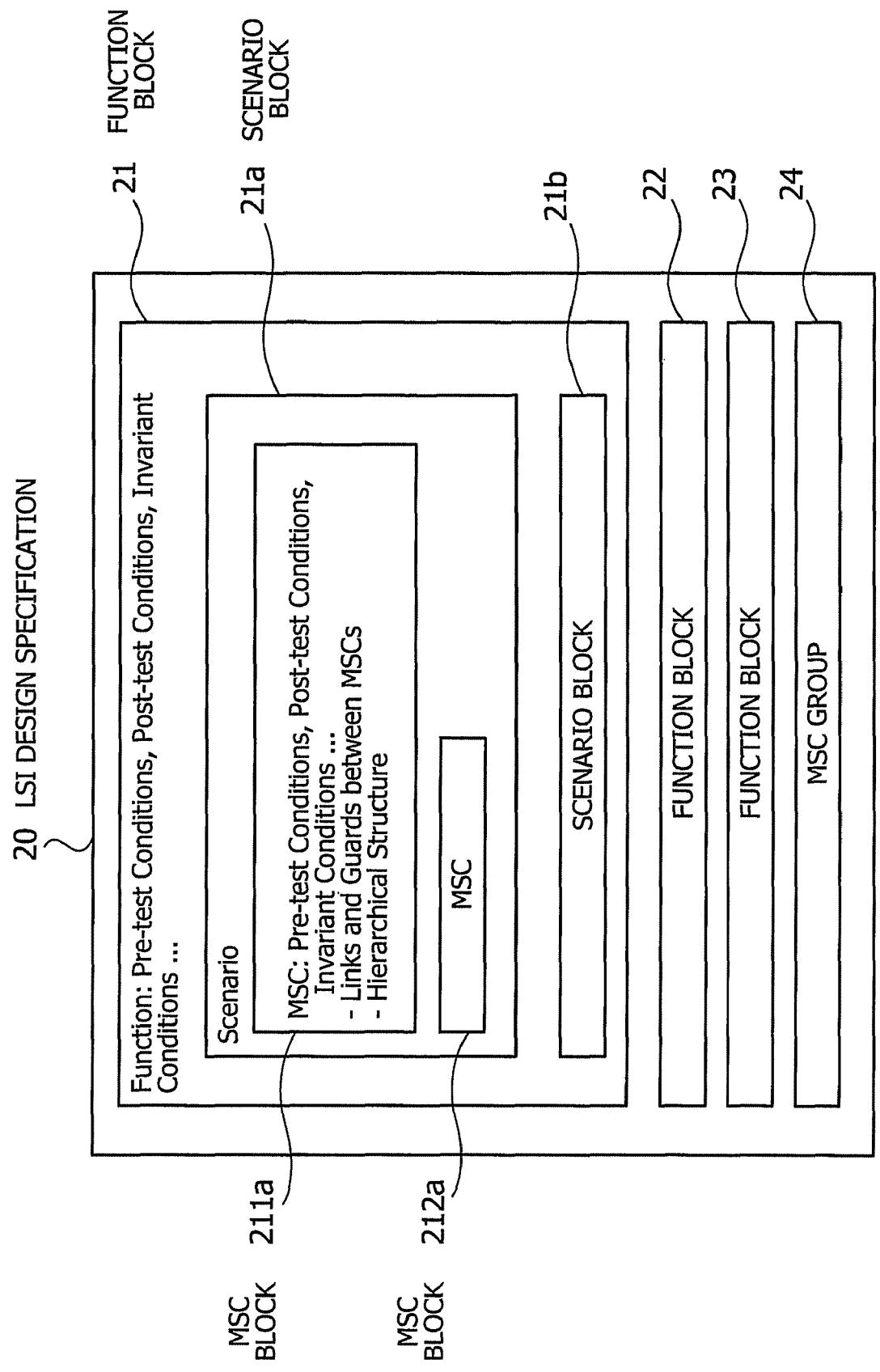
FIG. 4 illustrates a structure of an LSI design specification according to the second embodiment.

FIG. 4 illustrates a structure of an LSI design specification according to the second embodiment. As mentioned above, a design specification is provided as a collection of functions that describe what the implementation should comply with. The illustrated LSI design specification 20 is organized in list structure, using Extensible Markup Language (XML), for example.

Each function block 21, 22, and 23 describes a single function, which may be, for example, a hardware function called up by a software module, or a software function dependent on some hardware components. Each of those function blocks 21, 22, and 23 has one or more scenario blocks. Specifically, the illustrated function block 21 has two scenario blocks 21a and 21b.

Each scenario block 21a and 21b describes a single scenario that plays a substantive role in realizing its intended function. A function may include two or more scenarios corresponding to different calling conditions. More specifically, a scenario defines a series of operations that will be executed to realize an intended function. To put it in another way, a scenario gives an ordered set of messages exchanged between objects.

Each scenario block 21a and 21b contains one or more message sequence chart (MSC) blocks. In the example of FIG. 4, the illustrated scenario block 21a contains two MSC blocks 211a and 212a. Each MSC block 211a and 212a corresponds to a single message sequence chart.

A message sequence chart gives a set of sub-functions offered by the scenario. More specifically, message sequence charts provide a clear definition of what interactions will be made between objects involved in the function. Such objects may include functions described in the LSI design specification 20, as well as an external environment which may interact with the system including that LSI chip.

(b) Data Structure of LSI Design Specification

Figure 5:
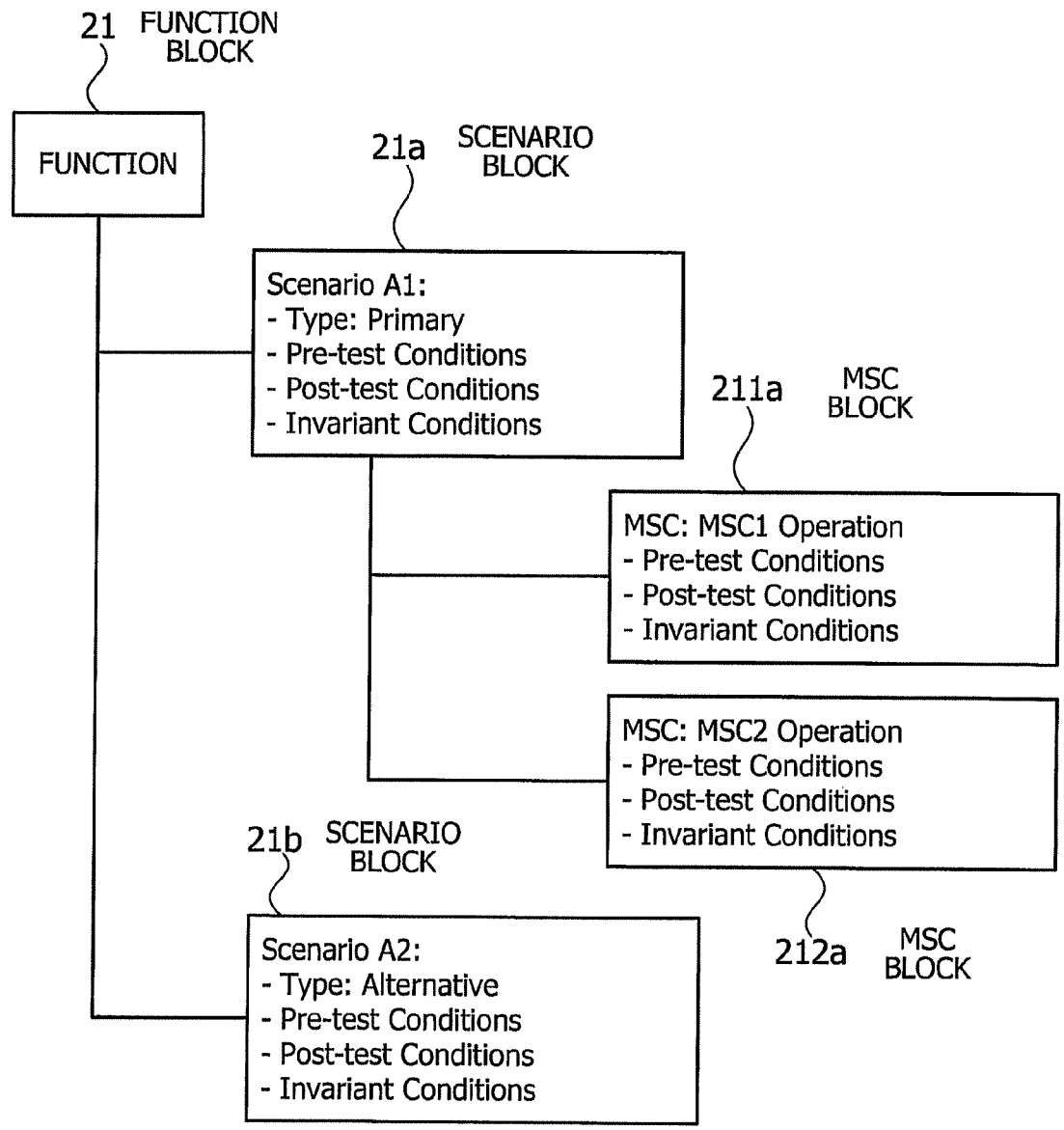
FIG. 5 illustrates an example data structure of an LSI design specification.

Referring to FIG. 5, an example data structure of an LSI design specification is illustrated.

As mentioned above, the LSI design specification is provided as a collection of functions. FIG. 5 depicts, in tree form, one of such functions constituting the design specification of FIG. 4. Each function may include one or more definitions of pre-test condition, post-test condition, and invariant condition as their execution constraints. A function contains descriptions of such conditions if any. In the case where there are no such conditions to apply, the function contains an indication of "No conditions" to state that fact. When, for example, the function has only a pre-test condition, its post-test condition and invariant condition are defined to be "No conditions."

As discussed above, the function block 21 defines a function which includes two scenarios A1 and A2 described in scenario blocks 21a and 21b, respectively. Each of those scenarios A1 and A2 bears a specific property, i.e., "Primary" (primary operation) or "Alternative" (alternative operation) or "Exceptional" (exceptional operation). The scenario blocks 21a and 21b indicate this property under the title of "Type."

In addition, those scenarios A1 and A2 may include one or more definitions of pre-test condition, post-test condition, and invariant condition as their execution conditions. Functions contain a description of such conditions if any, and in the case where there are no such conditions to apply, they contain an indication of "No conditions" to state that fact. In the example of FIG. 5, scenario A1 of primary operation includes such pre-test, post-test condition, and invariant conditions, as does scenario A2 of alternative operation.

Message sequence charts of MSC blocks 211a and 212a are distinguished by their respective identifiers, "MSC1 Operation" and "MSC2 Operation." Message sequence charts may include one or more definitions of pre-test condition, post-test condition, and invariant condition as their execution constraints. Message sequence charts contain a description of such conditions if any, and in the case where there are no such conditions to apply, they contain an indication of "No conditions" to state that fact.

The former message sequence chart "MSC1 Operation" includes pre-test, post-test condition, and invariant conditions, as does the latter message sequence chart "MSC2 Operation". While FIG. 5 does not illustrate it explicitly, there is at least one MSC block for the other scenario block 21b.

The LSI design specification 20 may also be represented as a single directed graph including a plurality of message sequence charts, or as a single message chart with a flat structure. In the latter case, the message sequence charts indicate the order of messages exchanged between objects. As yet another alternative method, the LSI design specification 20 may be represented as a plurality of cross-embedded directed graphs and a plurality of message sequence charts.

Figure 6:
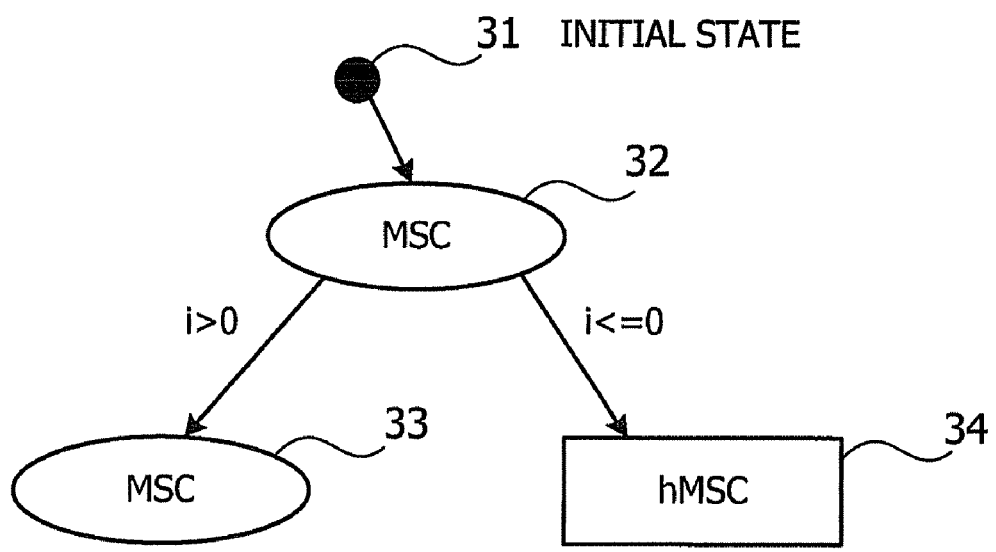
FIG. 6 illustrates relationships between message sequence charts and their hierarchical structure.

FIG. 6 illustrates relationships between message sequence charts and their hierarchical structure. According to the present embodiment, the LSI design specification 20 is hierarchically structured in the form of a directed graph 30. This directed graph 30 offers a compact representation of the LSI design specification 20.

The directed graph 30 includes a plurality of message sequence charts, and branches and merges that indicate relationships between those charts, as mentioned above. These relationships permit the message sequence charts to be sorted into one or more sequences.

Such message sequence charts indicate relationships between objects. That is, each message sequence chart is used to identify messages exchanged between objects and figure out in what order at least part of such messages are transmitted.

The illustrated directed graph 30 describes relationships between a plurality of functions executed by a particular function to authenticate prospective users. These functions are defined and visualized by message sequence charts. Each message sequence chart corresponds to a specific function, and the arrows interconnecting blocks indicate the execution order of the functions. The edges of the directed graph 30 are directional edges with optional guard conditions.

The directed graph 30 of FIG. 6 includes three functions represented respectively by two distinct message sequence charts 32 and 33 and one h message sequence chart (hMSC) 34. Here the h message sequence chart 34 expresses a hierarchy of message sequence charts in a collective manner. The solid circle is an initial state block 31, which serves as a pseudo state to provide the directed graph 30 with an entry point. Specifically, the initial state block 31 specifies which message sequence chart will be activated in the first place. That is, the arrow drawn from this initial state block 31 to the message sequence chart 32 indicates that a sequence of messages corresponding to the message sequence chart 32 will be communicated immediately upon entry to the directed graph 30. This communication of messages is then followed by either the message sequence chart 33 or the h message sequence chart 34.

As can be seen from the above explanation, the illustrated directed graph 30 includes two scenarios. That is, one scenario proceeds along a path that extends from the initial state block 31 to the topmost message sequence chart 32, and then down to the bottom-left message sequence chart 33 in FIG. 6. The other scenario goes from the initial state block 31 to the message sequence chart 32 and then proceeds to the h message sequence chart 34. Accordingly, both scenarios operate in the same way up to the message sequence chart 32, but will then be diverted into different operations.

The edges of the directed graph 30 are directional edges with optional guard conditions. Upon completion of messages given by the current message sequence chart, the guard condition of each edge is tested. If either condition is met, then a transition to the corresponding destination message sequence chart takes place. In the case of hMSC, the destination of this transition is its constituent message sequence chart in the same hierarchical level. In the example of FIG. 6, one guard condition "i>0" brings the state from the current message sequence chart 32 to the next message sequence chart 33. In the case where the other guard condition "i<=0" is met, the state moves instead to the h message sequence chart 34. This information serves effectively in making a complete verification of the directed graph 30 without duplicated execution of common portions of two scenarios.

Note here that message sequence charts in such a single directed graph 30 may refer to the same set of objects. Also, the directed graph 30 may be associated with some rules requiring that every message defined in a certain message sequence chart be executed before the next message sequence chart on the path becomes executable. The next section will describe a typical structure of message sequence charts.

(c) Message Sequence Chart

Figure 7:
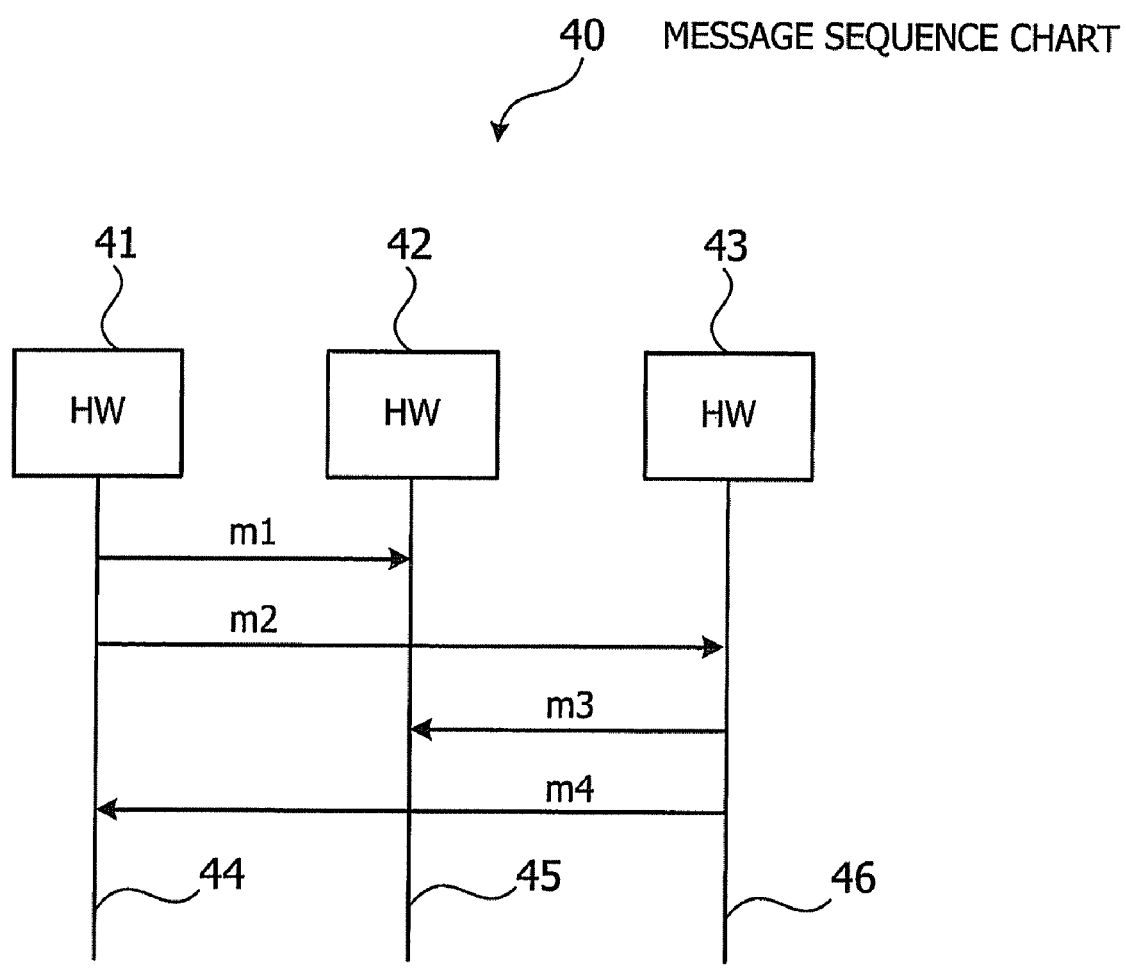
FIG. 7 illustrates an example structure of a message sequence chart.

FIG. 7 illustrates an example structure of a message sequence chart. As described earlier, message sequence charts provide a clear definition of what interactions will be made between objects involved in a function. Message sequence charts may involve, for example, hardware blocks of an LSI chip under development or objects serving as an external environment which may interact with a system under development.

The message sequence chart 40 illustrated in FIG. 7 includes a plurality of hardware (HW) objects 41, 42, and 43 and depicts a series of data event messages to be exchanged after such objects are generated. Those data event messages may be specified by the user. That is, the user is allowed to specify what messages are communicated between which objects. For example, the user may select one object and then another object by using a pointing tool (not illustrated). The selected objects are formed into a message sequence chart 40 in which a data event message is sent from the first-selected object having a transmit event to the second-selected object having a receive event.

The message sequence chart 40 is produced in the way described above to represent four data event messages m1 to m4 exchanged between hardware objects 41, 42, and 43 as indicated by the four arrows. As can be seen from the example of FIG. 7, object lines 44, 45, and 46 extend downward from the respective hardware objects 41, 42 and 43, and horizontal arrows are drawn between those object lines 44, 45, and 46 to represent inter-object data event messages.

Each data event message associates a transmitting object with a receiving object. The points at which those object lines 44, 45, and 46 meet data event messages m1 to m4 are called "events." Every data event message includes a transmit event associated with its transmitting object and a receive event associated with its receiving object. For example, the topmost data event message m1 in FIG. 7 runs between two object lines 44 and 45, meaning that the data event message m1 associates one hardware object 41 with a transmitting object, as well as another hardware object 42 with a receiving object. The data event message m1 further gives a transmit event at its one end point on the object line 44 and a receive event at its other end point on the object line 45.

Such object-event relationships defined in a message sequence chart are supposed to comply with the following two rules: The first rule requires that the transmit event s(m) of a data event message m precede its corresponding receive event r(m). This rule is expressed as s(m)<r(m). The second rule requires that the events on an object line be sequenced from the top to the bottom.

The above two rules mean that message sequence charts describe the order of data event messages between objects. For example, according to the first rule, the transmit event of data event message m1 occurs before the receive event of the same. According to the second rule, on the other hand, the transmit event of data event message m2 occurs before the receive event of data event message m4.

The same applies to other data event messages in FIG. 7. Referring to the time axis of the leftmost hardware object 41, data event messages m1 and m2 are transmitted in that order, and data event message m4 is received thereafter. On the time axis of the next hardware object 42, data event messages m1 and m3 arrive in that order. On the time axis of the rightmost hardware object 43, data event message m2 arrives first, and then data event messages m3 and m4 are transmitted in that order.

The above rules are transitive. For example, when event e1 precedes event e2 (i.e., e1<e2), and when event e2 precedes event e3 (e2<e3), this means that event e1 precedes event e3 (e1<e3).

The two rules, however, may not necessarily govern all ordered relationships between data event messages. Think of, for example, a message sequence chart that contains four objects and only two data event messages. In this message sequence chart, a first data event message is sent from a first object to a second object, and a second data event message is sent from a third object to a fourth object. The foregoing two rules, however, provide no particular order of those two data event messages in this example case. That is, the two data event messages can be sent in either order.

The hardware objects 42 and 43 in the example of FIG. 7 does not share their ordinal relationships on the time axis. Accordingly, the topmost data event message m1 and second data event message m2 may swap their positions in the sequence. Likewise, the third data event message m3 and fourth data event message m4 may swap their positions since the hardware objects 41 and 42 do not share their ordinal relationships on the time axis.

Figure 8:
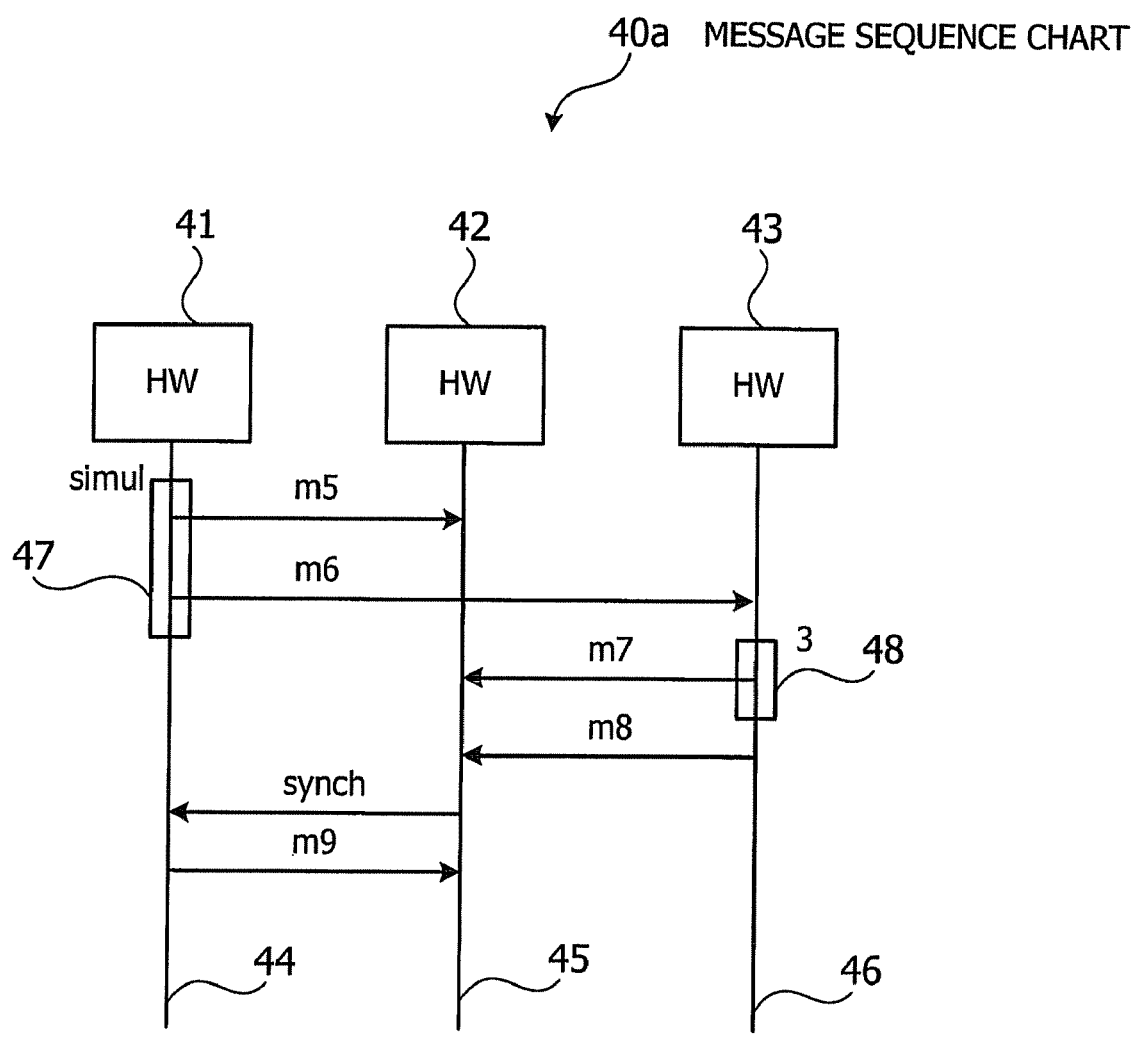
FIG. 8 illustrates another example of a message sequence chart.

FIG. 8 illustrates another example of a message sequence chart. The illustrated message sequence chart 40a includes three hardware objects 41, 42, and 43, where the sequence is defined with three enhanced functions that are referred to as simultaneity constraint, timeout constraint, and synchronization edge.

FIG. 8 depicts a simultaneity constraint and a timeout constraint in the form of a box enclosing events. Specifically, the box 47 labeled "simul" represents a simultaneity constraint. This box 47 binds the enclosed events into a group of simultaneous events. In the example of FIG. 8, the box 47 binds two transmit events associated with data event messages m5 and m6.

The box 48 represents a timeout constraint, with an integer number affixed to indicate a specific timeout value. When such a timeout constraint is encountered during the execution of a sequence, the execution is suspended until the specified timeout period expires. In this timed execution model, the sequence cannot resume until the expiration of a given timeout period. In the example of FIG. 8, data event message m7 is transmitted after a lapse of three unit times, as indicated by the label "3" beside the box 48.

Synchronization edges are used to establish a fixed ordinal relationship between data event messages. Synchronization edges have the same appearance as ordinary data event messages, except that they are labeled "synch." Accordingly, data event messages having a label of "synch" will be referred to as synchronization messages.

Think of, for example, a synchronization edge including a transmit event on one hardware object 42 and a receive event on another hardware object 41. In this case, a synchronization message is sent from the hardware object after it receives a data event message m8. The synchronization message is received by the hardware object 41 before it sends a data event message m9.

According to the message sequence chart 40a, the hardware object 42 is supposed to receive data event message m8 before the hardware object 41 sends data event message m9. A synchronization edge, when added, creates a relationship between multiple objects which are otherwise unrelated to each other. According to an embodiment, however, synchronization edges do not actually produce any messages between interrelated objects. In FIG. 8, the synchronization message actually produces a transmit event for data event message m9 after receive events of data event messages m7 and m8, rather than sequencing those data event messages m7, m8, and m5 by comparing them with each other.

(d) Design Verification Apparatus

Figure 9:
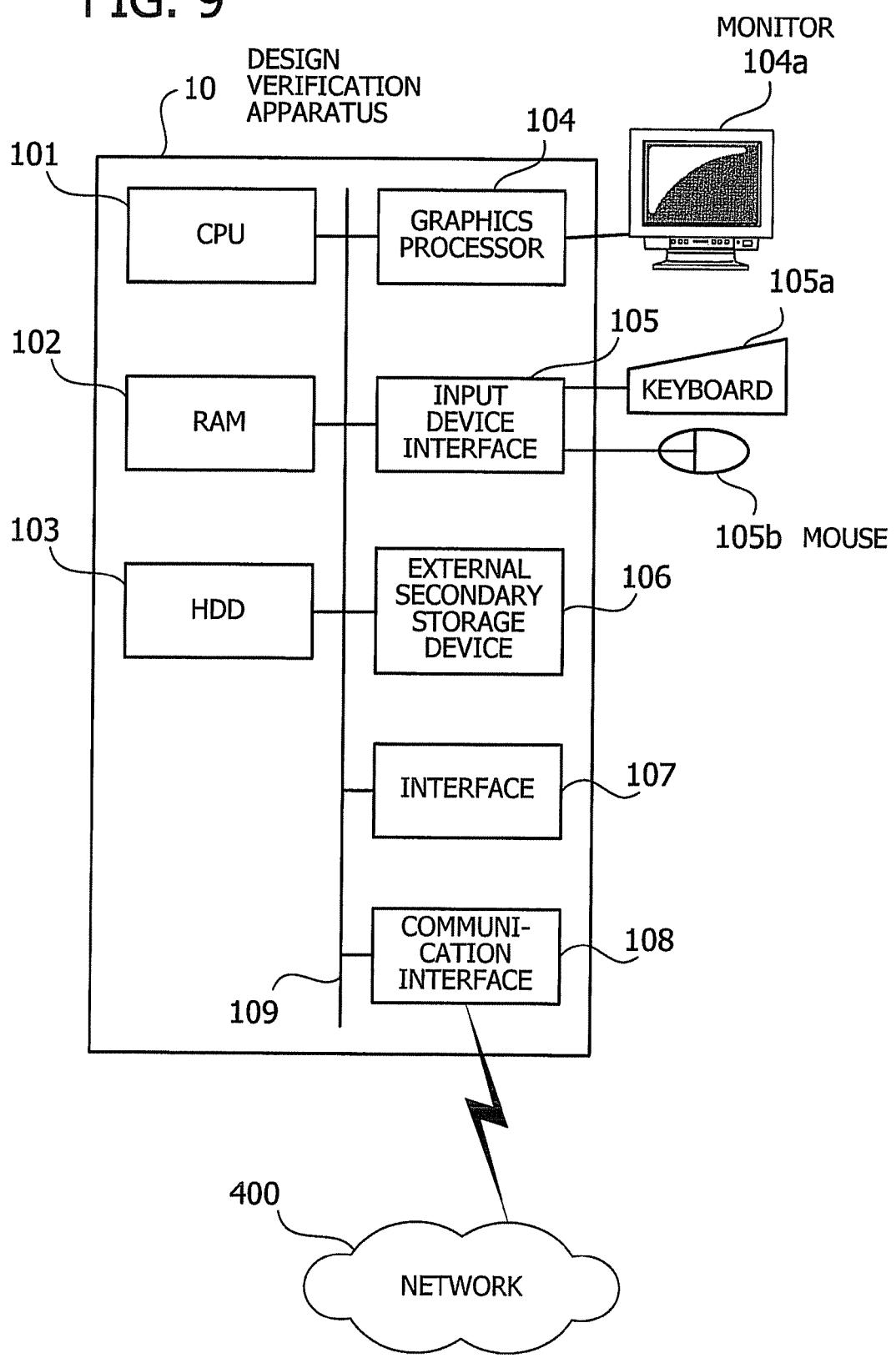
FIG. 9 illustrates a hardware configuration of the design verification apparatus.

Referring now to the block diagram of FIG. 9, a hardware configuration of the design verification apparatus 10 will be described below. The illustrated system has the following hardware elements: a central processing unit (CPU) 101, a random access memory (RAM) 102, a hard disk drive (HDD) 103, a graphics processor 104, an input device interface 105, an external secondary storage device 106, an interface 107, and a communication interface 108. The CPU 101 controls the entire computer system of this design verification apparatus 10, interacting with other elements via a bus 109. Specifically, the CPU 101 manipulates information received from the input device interface 105, external secondary storage device 106, interface 107, and communication interface 108.

The RAM 102 serves as temporary storage for the whole or part of operating system (OS) programs and application programs that the CPU 101 executes, in addition to other various data objects manipulated at runtime. The HDD 103 stores program and data files of the operating system and applications. In addition, the HDD 103 stores list structures scripted with the Extensible Markup Language (XML).

The graphics processor 104, coupled to a monitor 104a, produces video images in accordance with drawing commands from the CPU 101 and displays them on a screen of the monitor 104a. The input device interface 105 is used to receive signals from external input devices, such as a keyboard 105a and a mouse 105b. Those input signals are supplied to the CPU 101 via the bus 109.

The external secondary storage device 106 reads data from, and optionally writes data to, a storage medium. Such storage media include magnetic storage devices, optical discs, magneto-optical storage media, and semiconductor memory devices, for example. Magnetic storage devices include hard disk drives (HDD), flexible disks (FD), and magnetic tapes, for example. Optical discs include digital versatile discs (DVD), DVD-RAM, compact disc read-only memory (CD-ROM), CD-Recordable (CD-R), and CD-Rewritable (CD-RW), for example. Magneto-optical storage media include magneto-optical discs (MO), for example.

The interface 107 is a hardware device configured to transmit and receive data to/from an external device connected to the design verification apparatus 10. Specifically, the interface 107 is used to communicate with a device 300 under test through a signal interface 200 (see FIG. 2). The communication interface 108 is connected to a network 400, allowing the CPU 101 to exchange data with other computers (not illustrated) on the network 400.

Figure 10:
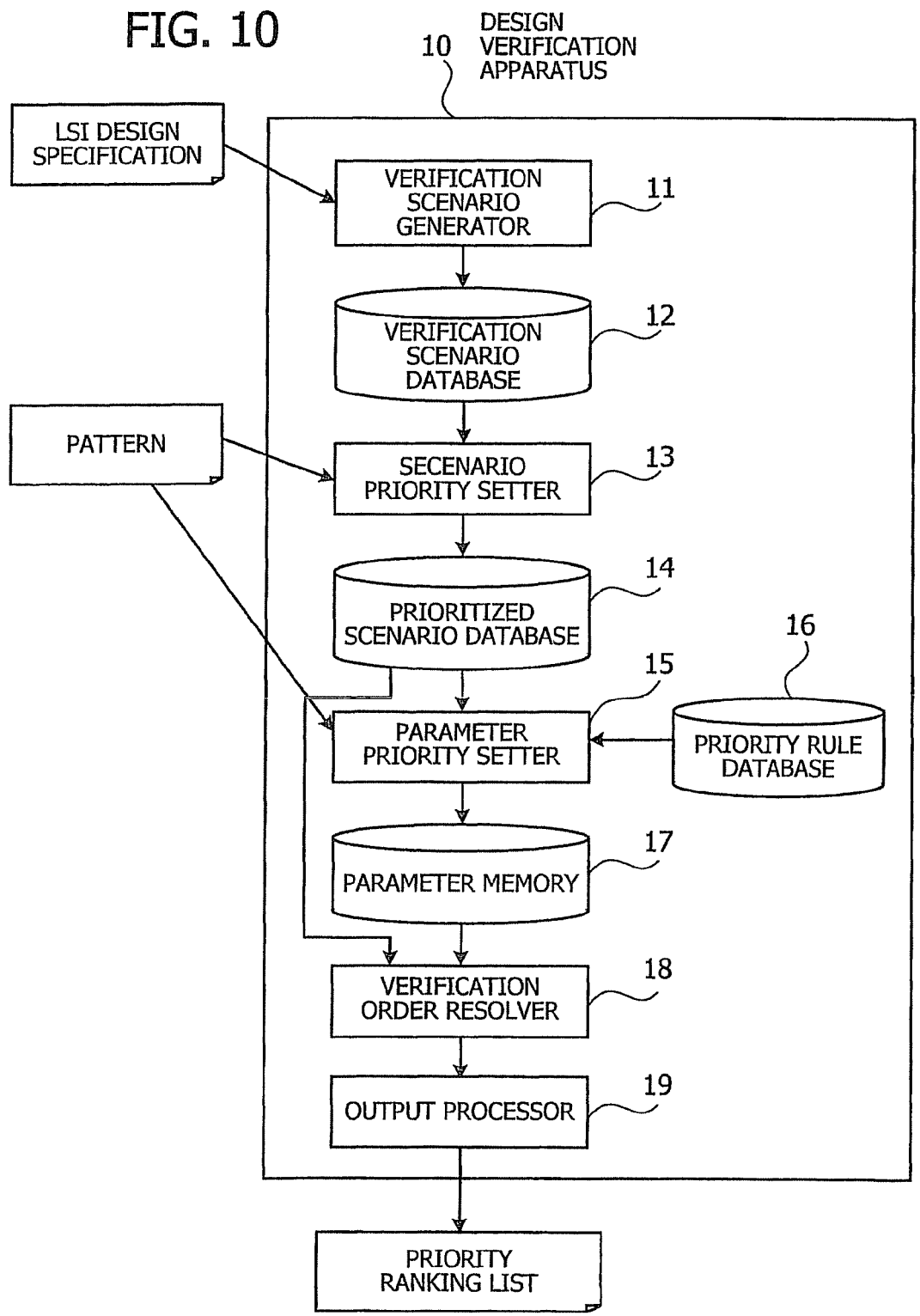
FIG. 10 is a block diagram illustrating functions provided in the design verification apparatus.

The processing functions of the present embodiment (as well as subsequent embodiments and their variations) can be realized on such a hardware platform. FIG. 10 is a block diagram illustrating functions provided in the design verification apparatus 10. This design verification apparatus 10 includes a verification scenario generator 11, a verification scenario database 12, a scenario priority setter 13, a prioritized scenario database 14, a parameter priority setter 15, a priority rule database 16, a parameter memory 17, a verification order resolver 18, and an output processor 19. While not illustrated in FIG. 10, the design verification apparatus 10 may include some tools for generating message sequence charts or creating a state machine based on given message sequence charts.

The verification scenario generator 11 produces a verification scenario for each processing scenario based on the data of an LSI design specification 20 which was discussed in FIGS. 4 and 5.

Verification scenarios associate a message sequence chart of each processing scenario described in the given LSI design specification 20 with labels (identifiers) obtained from that design specification. The labels designate which portion of the design specification (e.g., a specific function, scenario, or message sequence chart) is to be verified. Here the verification scenarios serve as a kind of intermediate data for subsequent processing to be performed by the scenario priority setter 13.

While not explicitly illustrated in FIG. 10, the verification scenario generator 11 has a temporary memory to store data produced in the course of verification scenario generation. The verification scenario database 12 is where the verification scenarios produced by verification scenario generator 11 are stored for subsequent use.

The scenario priority setter 13 assigns priority scores (process priorities) to verification scenarios, according to a pattern specified by the user. This pattern may include, among others, data items equivalent to the foregoing identifiers. More specifically, the pattern includes at least one of function names, scenario names, scenario types (primary operation, alternative operation, exceptional operation), MSC names, and their logical combinations. Some patterns may specify process priorities.

With respect to scenario types, an example pattern "Primary>Exceptional" places primary operation in preference to exceptional operation. With respect to MSC names, an example pattern "Authentication Done>Query" gives a higher priority to successful authentication than query. Yet another example pattern "Authentication Failed>Authentication Done>Query" further prioritizes failed authentication over successful authentication.

The prioritized scenario database 14 stores verification scenarios with priority scores assigned by the scenario priority setter 13. These scenarios are referred to as "prioritized scenarios." The prioritized scenarios serve as a kind of intermediate data for subsequent processing to be performed by the parameter priority setter 15.

The parameter priority setter 15 receives a pattern which may include: (1) processing scenario, (2) parameter information (a set of parameter values), and (3) constraints on the specified processing scenario of (1). Note that the pattern may include a plurality of different constraints for one scenario. The parameter priority setter 15 assigns specific priority scores to the parameters specified as scenario constraints in the received pattern. The parameter priority setter 15 also identifies which verification scenarios are to be used to test the specified processing scenario, thus obtaining combinations of the identified verification scenarios and their parameter values. The next section will describe parameter information and constraints.

(e) Parameter Information

FIG. 11 illustrates several parameters. The LSI design specification 20 may include parameter information to provide clear definitions of pre-test and post-test conditions, aside from the hierarchical structure of functions. Specifically, the LSI design specification 20 contains registers and ports to which parameters are assigned. FIG. 11 depicts four blocks each representing a specific register or a specific port.

Register blocks 25a and 25b contain register information formed from the following property fields: "Parameter Name," "Type," "Maximum Value," "Minimum Value," and "Ideal Value."

The parameter name field indicates the name of a register that is defined in the design specification for the purpose of reference from external entities. For example, the register block 25a has a parameter name of register "V" as part of the register information.

The type field indicates the data type of a variable. For example, the register block 25a contains register information of "integer" type.

The minimum value, maximum value, and ideal value fields indicate conditions for extracting parameter values. For example, the register block 25a contains minimum and maximum values (e.g., 0 and 137) that the register V can accommodate.

The ideal value field may optionally be defined by the user. For example, one register block 25a contains an ideal value of 14 as part of its register information, while the other register block 25b contains a value of "NA" (not applicable) to indicate the absence of ideal value definitions.

Port blocks 26a and 26b each provide port information describing a particular port. The port information is formed from the following property fields: "Port Name," "Type," "Maximum Value," "Minimum Value," and "Model Value."

The port name field indicates the name of a port that is defined in the design specification for the purpose of reference from external entities. For example, the port block 26a has a parameter name of port "INT1" as part of its port information.

The type field indicates the data type of a variable. For example, the port block 26a has a type of "[0:1]" as part of its port information.

The minimum value, maximum value, and ideal value fields indicate conditions for extracting parameter values. For example, the port block 26a contains minimum and maximum values (e.g., 0 and 3) that the port INT1 can accommodate.

The ideal value field may optionally be defined by the user. For example, one port block 26a has an ideal value of "0" as part of its port information, while the other port block 26b contains a value of "NA" (not applicable) to indicate the absence of ideal value definitions.

FIG. 12 illustrates a data structure of the parameters of FIG. 11. Parameters are given in the form of, for example, XML as illustrated in FIG. 12. This XML-based data 27 includes, among others, descriptions 27a to 27d. The first two descriptions 27a and 27b describe the register blocks 25a and 26a, respectively. The second two descriptions 27c and 27d describe the port blocks 26a and 26b, respectively.

Referring back to FIG. 10, the priority rule database 16 stores priority rules that the parameter priority setter 15 will use to assign priority scores to given parameter values. Priority rules may be defined previously by the user. The following is an example of priority rules:

Ideal values have a priority score of 1.

In the case where no ideal values are defined, the median value (average of maximum and minimum values) is taken as an ideal value and given a priority score of 2.

Maximum and minimum values have a priority score of 10.

Boundary values (e.g., zero, numbers at bit boundaries) have a priority score of 4. Past experiences suggest that boundary values are often where a bug occurs. This fact justifies higher priority scores of boundary values over ideal values. The boundary values include binary numbers at a bit boundary where a carry from lower digits to upper digits is produced. For example, 7 (0111) and 8 (1000) are among such boundary values, as are 63 (0111111) and 64 (1000000).

Values adjacent to a boundary value have a priority score of 5.

Values that led to a bug in the past design projects have a priority score of 7.

Priority scores are incremented by one in the case of control-related parameters (e.g., interrupt signals). For non-control-related parameters (e.g., image sizes), their priority scores are decremented by one.

Based on the above priority rules, and according to given constraints and parameters, the parameter priority setter 15 assigns a priority score to each specified parameter value. Suppose, for example, the case where the parameter priority setter 15 has received the foregoing parameter descriptions of FIG. 11 along with a pre-test condition (constraint) specifying "V=14" as a parameter value. Since the given parameter value V=14 coincides with what the parameter information defines as the ideal value of register V, the parameter priority setter 15 gives a priority score of 1 to that parameter value.

Unlike the above example, the given parameter value may not always match with the values that the user has defined in the priority rule database 16. For such parameter values, the user may previously establish a rule that a default priority score (e.g., zero) be applied to those values. When, for example, no specific priority scores are defined for ideal values, the parameter priority setter 15 assigns a priority score of zero to the parameter with an ideal value.

(f) Constraints

As mentioned earlier, the pattern items may include one or more definitions of pre-test condition, post-test condition, and invariant condition as their execution constraints. The design verification apparatus 10 may be configured to only use the constraints that are given as a pattern when it determines priority scores of verification scenarios. The design verification apparatus may also use constraints described in a message sequence chart, together with user-specified constraints, by evaluating a logical expression (e.g., logical product, logical sum) combining them.

The use of a logical product may sometimes involve conflicting conditions. Suppose, for example, that a message sequence chart specifies x>1 as a pre-test condition, as opposed to the pre-test condition x<1 specified by a given pattern. These two pre-test conditions exclude each other. In this case, the design verification apparatus 10 removes the combination of verification scenarios including such a conflicting message sequence chart and parameter values from the subject of priority setting, meaning that those scenarios will not be used. The same applies also to post-test conditions and invariant conditions.

The parameter memory 17 stores parameters which have been assigned priority scores corresponding to scenarios. The verification order resolver 18 determines the priority (verification order) of each combination of given prioritized scenarios and parameter values by using an evaluation function to evaluate their priority scores. The evaluation function may give, for example, the sum of priority scores, or may be some other functions that combine addition and multiplication operations. In the former case, the verification order resolver 18 sums up the priority score of a verification scenario for a specified processing scenario and that of a parameter value given as a constraint. This calculation is made for each specified scenario when there are two or more such scenarios. In the case where one specified scenario has two or more constraints, the verification order resolver 18 performs this calculation for each specified constraint. The verification order resolver 18 then compares the resulting sums with each other, thereby setting a specific priority ranking to each combination of scenarios and parameter values in descending order of their corresponding sums. The scenarios are thus prioritized according to the given parameters.

The output processor 19 sorts the combinations of scenarios and parameter values in descending order of their respective overall priority scores that the verification order resolver 18 has determined. The output processor 19 outputs the sort result as a priority ranking list which enumerates, in a predetermined format, the prioritized scenarios in combination with parameter values. Alternatively, the output processor 19 may be configured to sort those combinations according to sort conditions specified by the user.

Figure 13:
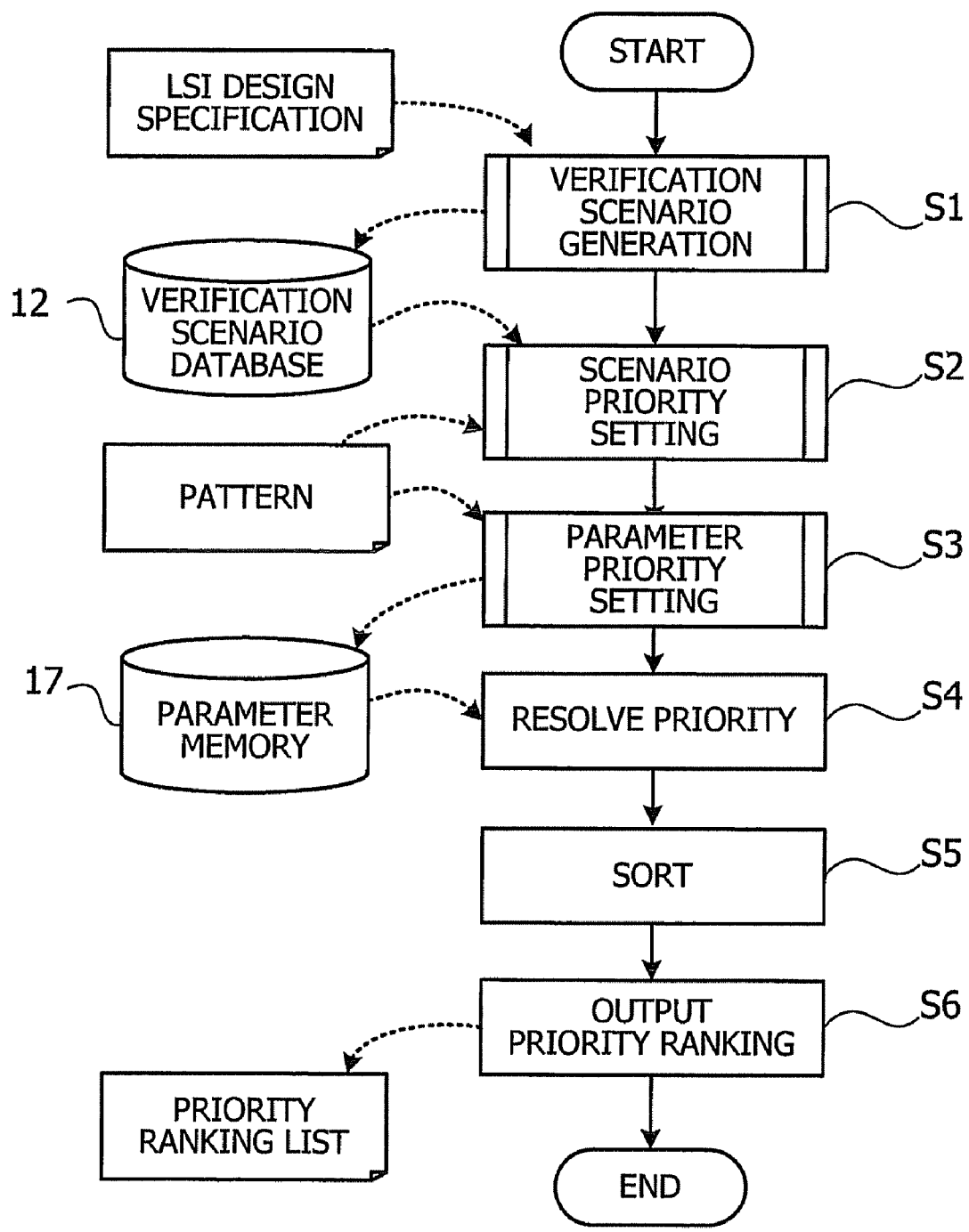
FIG. 13 is a flowchart that gives a general view of what the design verification apparatus performs.

Referring now to the flowchart of FIG. 13, the following will describe a general view of what the proposed design verification apparatus performs.

At the outset, the verification scenario generator 11 executes a verification scenario generation process on the basis of an LSI design specification 20 specified by the user, so as to generate verification scenarios (step S1). The generated verification scenarios are then saved in a verification scenario database 12.

Subsequently the scenario priority setter 13 executes a priority setting process based on a user-specified pattern, thus assigning priority scores to the verification scenarios stored in the verification scenario database 12 (step S2). Those prioritized scenarios are saved in a prioritized scenario database 14.

The parameter priority setter 15 executes a parameter priority setting process to determine a priority score of each given parameter value (step S3) and saves the determined priority scores in a parameter memory 17, together with the information about their associated scenarios.

The verification order resolver 18 executes a priority resolving process to determine a priority ranking of each combination of scenarios and parameter values, based on the priority scores of prioritized scenarios and parameter values (step S4). Specifically, the verification order resolver 18 evaluates the priority scores of every combination of given scenarios and parameter values by using an appropriate evaluation function to calculate an overall priority score, thereby finalizing their priority ranking. The output processor 19 sorts the combinations of scenarios and parameter values in descending order of their overall priority scores that has been determined (step S5). The output processor 19 then outputs the sort result as a priority ranking list, which enumerates the prioritized scenarios in combination with parameter values (step S6).

The above-described general process flow may be modified to include some interaction with the user. For example, the verification scenario generator 11 may generate verification scenarios beforehand and save the result in the verification scenario database 12. The design verification apparatus 10 then waits for entry of a pattern from the user before starting verification scenario generation.

Figure 14:
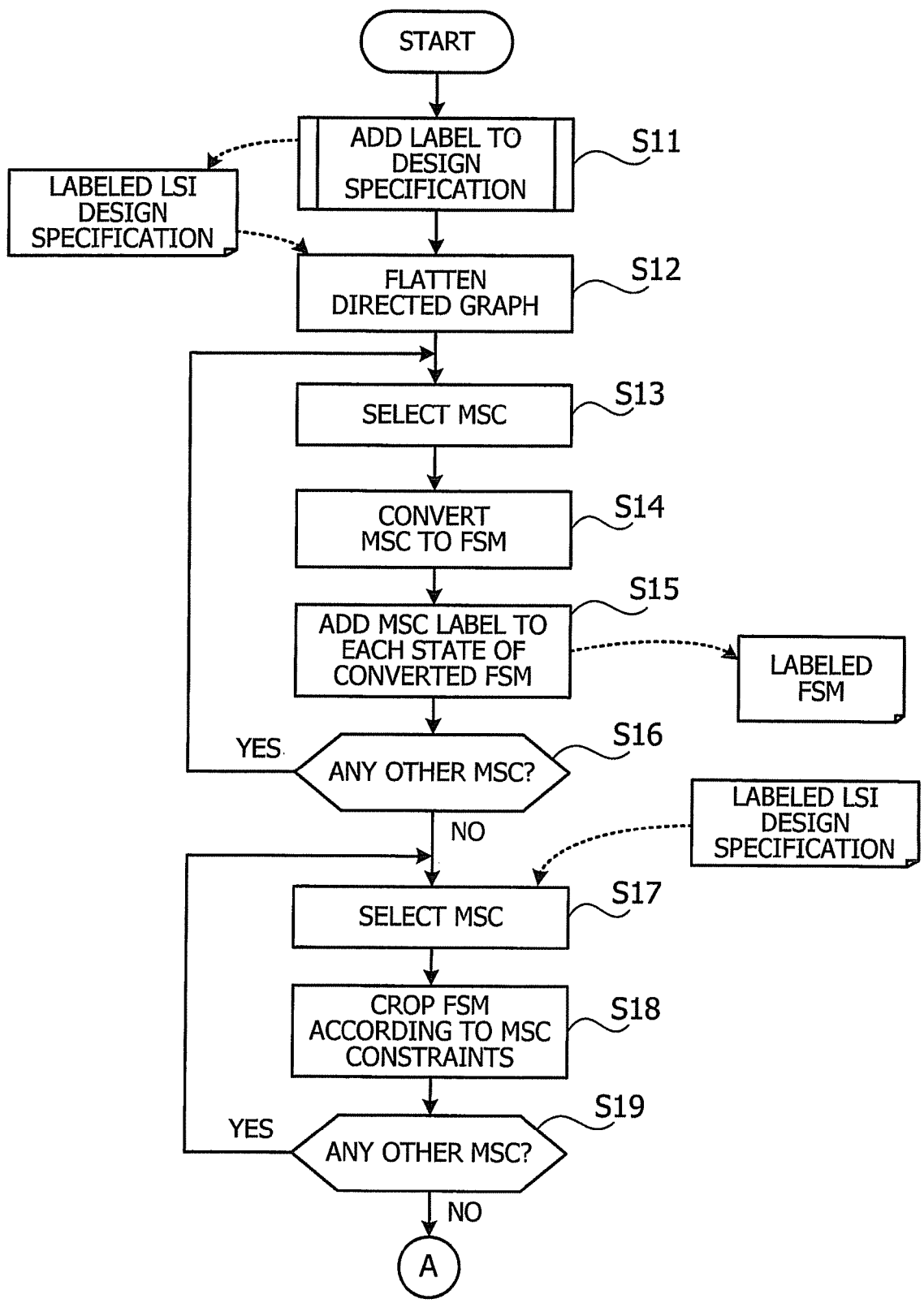
FIGS. 14 and 15 are a flowchart illustrating of a verification scenario generation process.
Figure 15:
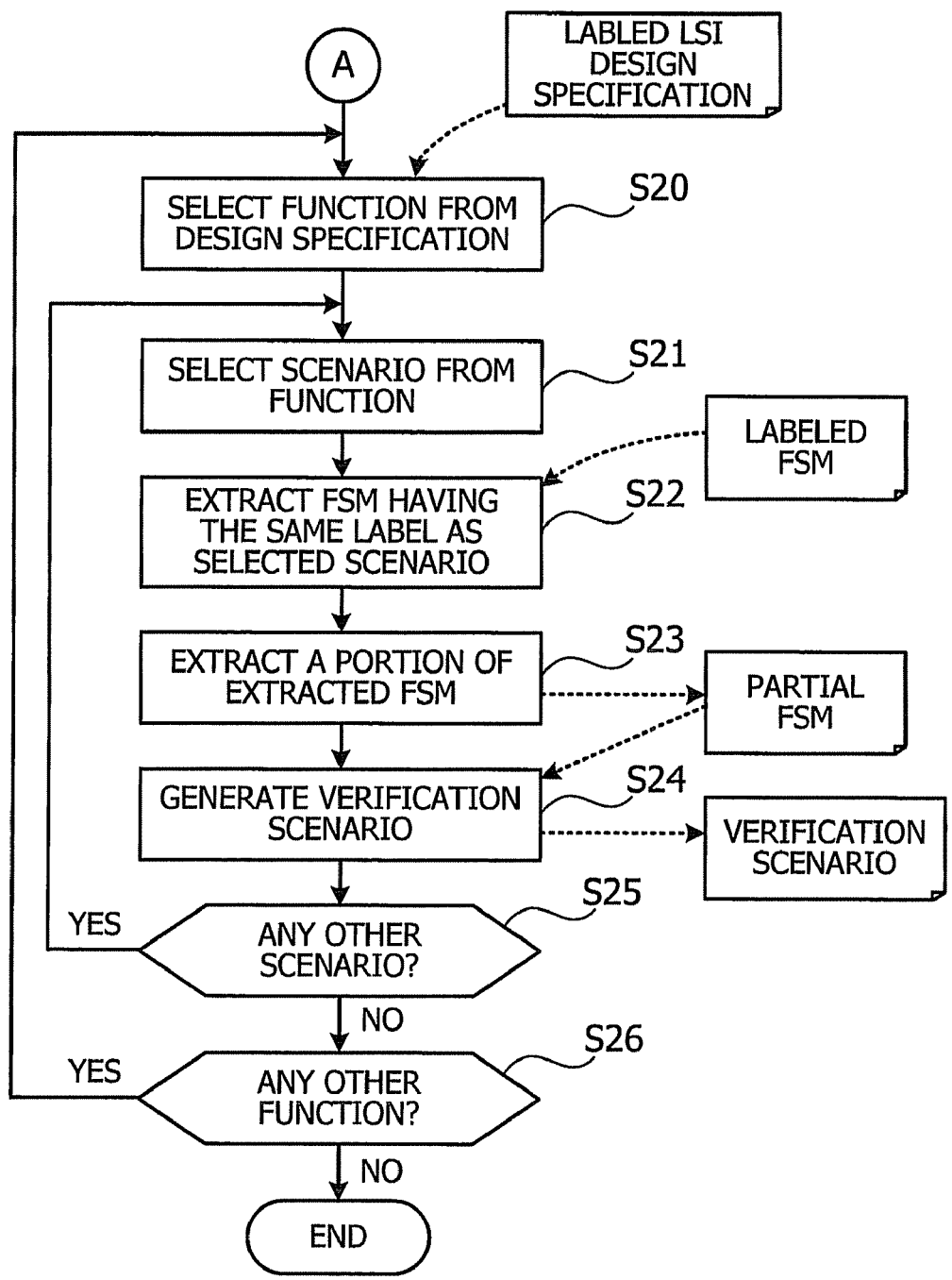

Referring now to the flowchart of FIGS. 14 and 15, the following will provide details of the verification scenario generation process called at step S1. This process proceeds as follows:

The verification scenario generation process first calls another process to add labels to the LSI design specification 20 (step S11). Details of this labeling process will be described later with reference to another flowchart. The process then flattens, or removes hierarchical structure from, a directed graph of the labeled LSI design specification (step S12). Out of the flattened directed graph, the process selects one message sequence chart (MSC) (step S13) and converts the selected message sequence chart into a finite state machine (FSM) (step S14). As a result of this step S14, data event messages exchanged in a series of message sequence charts are expressed as a finite state machine, as will be described in detail later.

The process adds a label to each state of the finite state machine (step S15). This label is what the currently selected message sequence chart has gained at step S11. As a result of steps S14 and S15, the finite state machine obtains labels with its states. The verification scenario generator 11 saves the resulting labeled finite state machine in its local temporary memory.

It is then determined whether there is any other message sequence chart that awaits processing (step S16). If there is such an unselected message sequence chart (YES at step S16), the process returns to step S13 to select it and executes subsequent steps S14 and S15 with that newly selected message sequence chart. If no unselected message sequence charts are found (NO at step S16), the process consults the labeled design specification saved in step S11 and selects therefrom one message sequence chart (step S17).

The selected message sequence chart may contain some constraints (e.g., synch, timeout). According to such constraints, the process crops the finite state machine by removing unnecessary states from the selected message sequence chart (step S18). Details of this step will be described later.

It is then determined whether there is any other message sequence chart that awaits processing (step S19). If there is found an unselected message sequence chart (YES at step S19), the process returns to step S17 to select it and executes subsequent step S18 with that newly selected message sequence chart. If no unselected message sequence charts are found (NO at step S19), the process selects a function out of those defined in the labeled LSI design specification (step S20 in FIG. 15).

The process then selects a scenario from the selected function (step S21) and extracts, from the labeled finite state machines produced at step S15, a finite state machine having the same label as the selected scenario (step S22). The process further extracts a portion of the finite state machine extracted at step S22, which is referred to as a "partial finite state machine" (step S23). The verification scenario generator 11 saves the extracted partial finite state machine in its temporary memory. The process then generates a verification scenario from the partial finite state machine of step S23 and enters it to the verification scenario database 12 (step S24), as will be described in detail later.

It is determined whether there is any other scenario in the function selected at step S20 (step S25). If there is an unselected scenario (YES at step S25), the process returns to step S21 to select it and executes subsequent steps S22 to S24 with that newly selected scenario. If no unselected scenarios are found in the function selected at step S20 (NO at step S25), then the process determines whether there is any other function that awaits processing (step S26). If there is such an unselected function (YES at step S26), the process returns to step S20 to select it and executes subsequent steps S21 to S25 with that newly selected function. If no unselected function are found (NO at step S26), the verification scenario generation process terminates itself.

Figure 16:
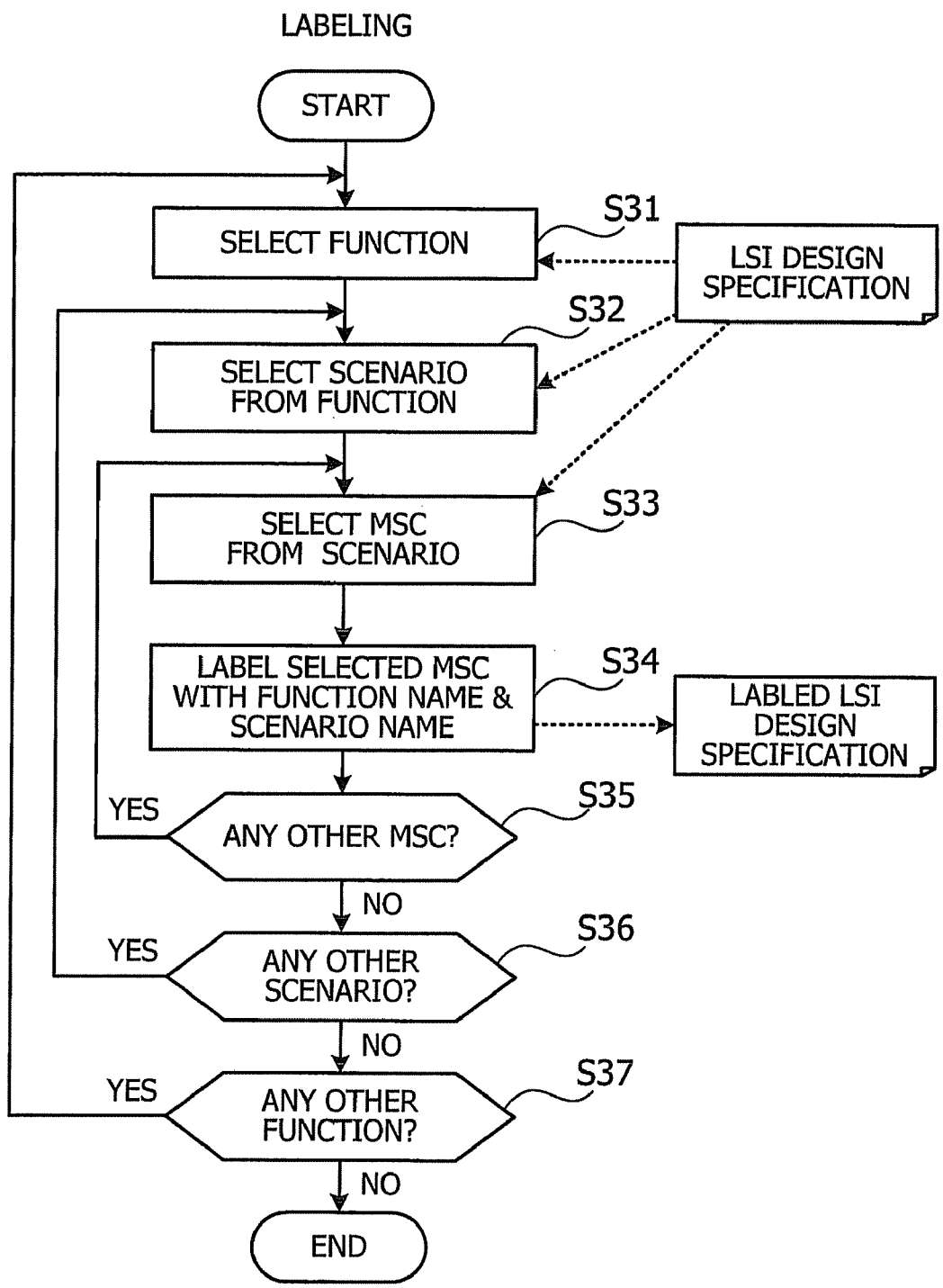
FIG. 16 is a flowchart illustrating a labeling process.

Referring now to the flowchart of FIG. 16, the following will provide details of the labeling process executed at step S11 (FIG. 14). This process proceeds as follows:

The labeling process first selects a function from those defined in a given LSI design specification 20 (step S31) and then selects a scenario out of the selected function (step S32). The process further selects a message sequence chart in the selected scenario (step S33).

The process adds a label to this message sequence chart (step S34), which includes the function name of the currently selected function (i.e., the one selected at step S31) and the scenario name of the currently selected scenario (i.e., the one selected at step S32). In the case where the message sequence chart has an existing label, that label is updated with the additional label. The label may also include a message sequence chart name, in addition to the above-noted function name and scenario name.

The process now looks into the currently selected scenario to determine whether there is any other message sequence chart that awaits processing (step S35). If there is found such an unselected message sequence chart in the scenario (YES at step S35), the process returns to step S33 to select it and executes subsequent step S34 with the newly selected message sequence chart. If no unselected scenarios are found (NO at step S35), then the process determines whether there is any other scenario that awaits processing (step S36). If there is such an unselected scenario (YES at step S36), the process returns to step S32 to select it and executes subsequent steps S33 to S35 with that newly selected scenario.

If no unselected scenarios are found (NO at step S36), then the process determines whether there is any other function that awaits processing (step S37). If there is such an unselected function (YES at step S37), the process returns to step S31 to select it and executes subsequent steps S32 to S36 with that newly selected function. If no unselected function are found (NO at step S37), the labeling process terminates itself.

Figure 17:
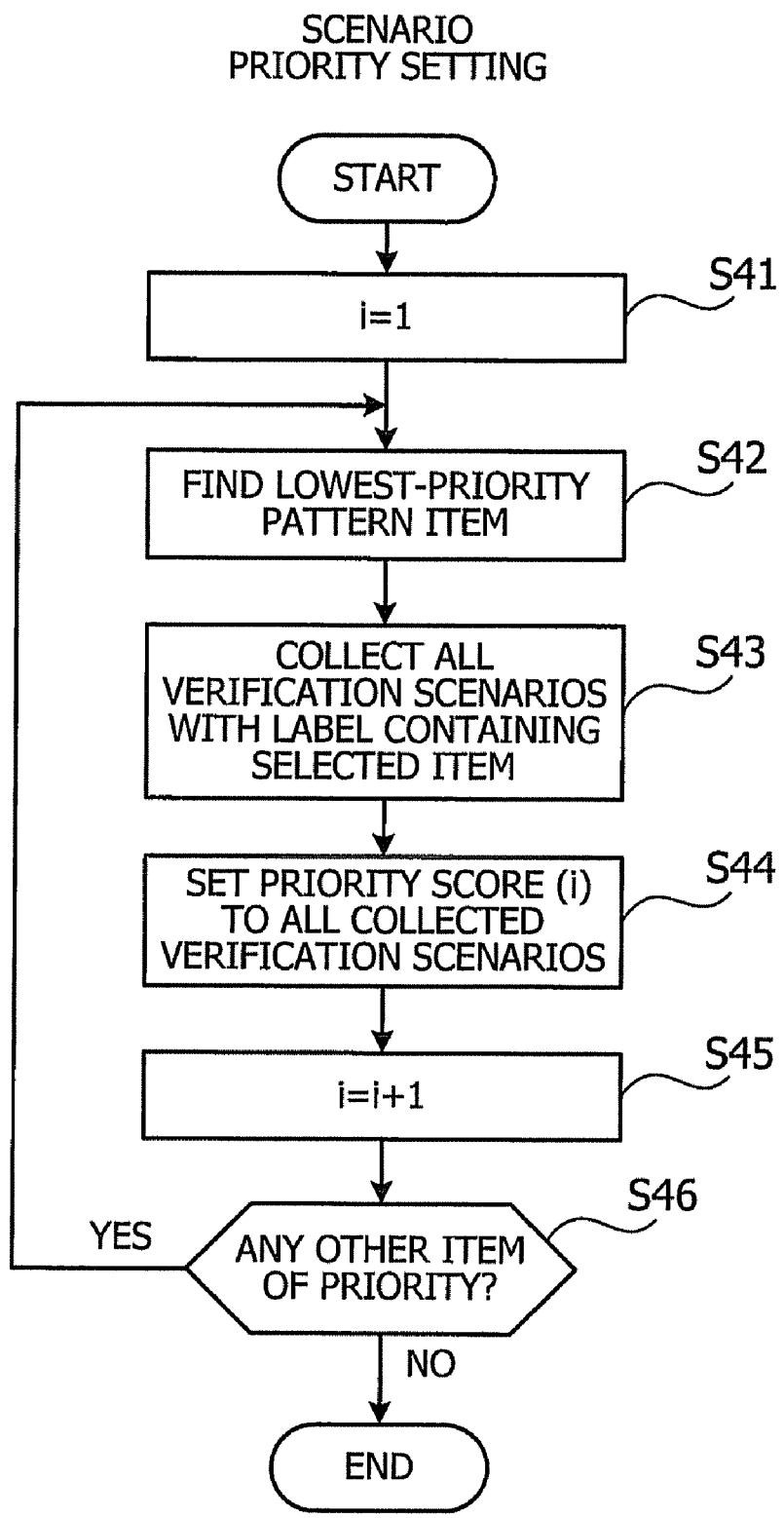
FIG. 17 is a flowchart of a scenario priority setting process.

Referring now to the flowchart of FIG. 17, the following will provide details of the scenario priority setting process called at step S2 of FIG. 13. With a given pattern, this process proceeds as follows:

At the outset, the process initializes parameter i to zero (step S41). Then out of the items available in the given pattern, the process selects an item with the lowest priority (step S42). Suppose, for example, that the pattern specifies priorities of pattern items as in "Primary>Exceptional." The process thus selects the item "Exceptional" in the first place. The selected pattern item may be found in the labels of some verification scenarios. The process then collects verification scenarios that have such matching labels in all of their states (step S43). Those verification scenarios are assigned a priority score of i (step S44).

The process then increments parameter i by one (step S45) and determines whether there are any other items in the given pattern (step S46). If there are such remaining items (YES at step S46), the process returns to step S42 to select one with the highest priority and executes subsequent steps S43 to S45 with that newly selected item. If no unselected items are found (NO at step S46), the scenario priority setting process terminates itself.

Figure 18:
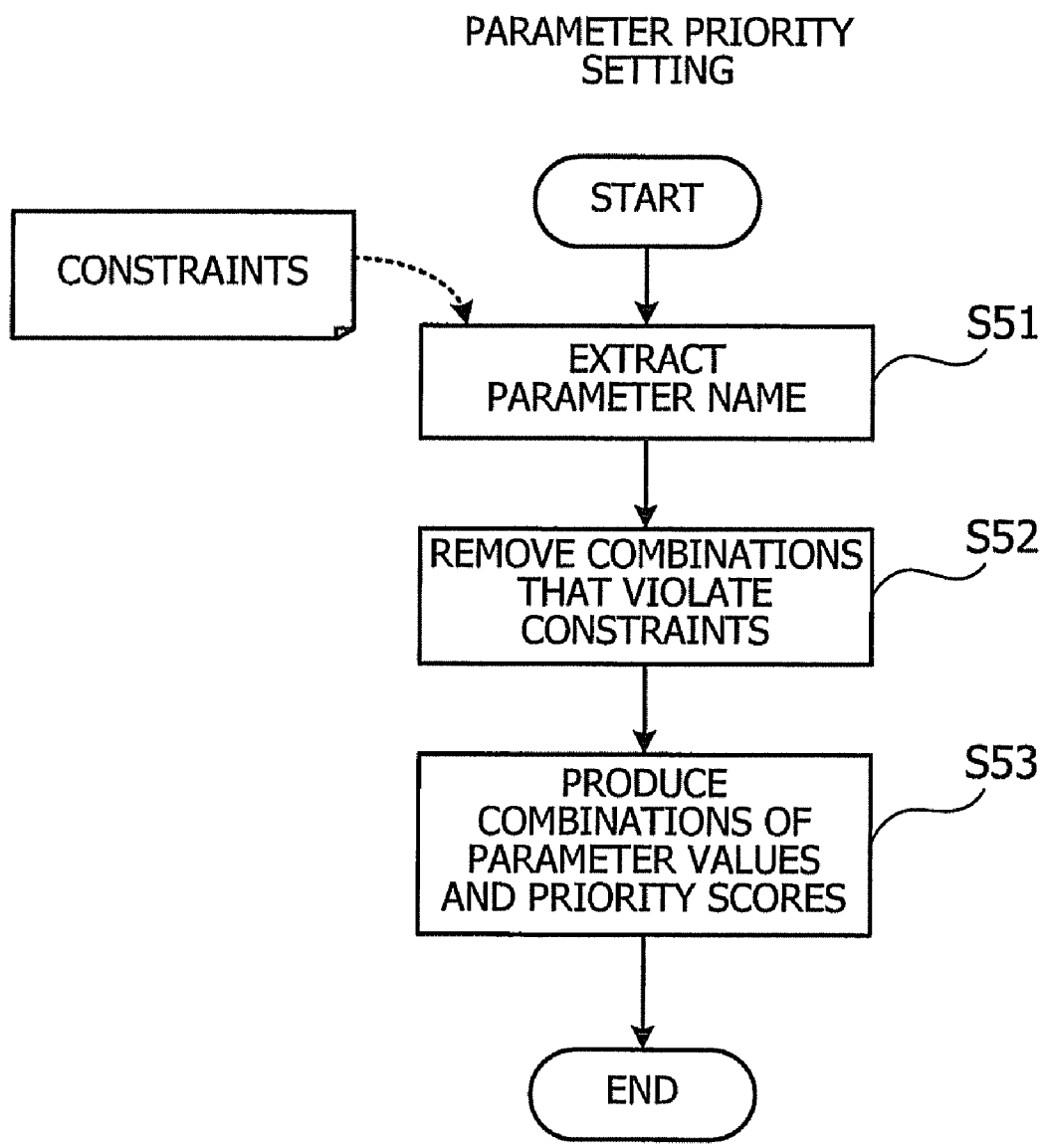
FIG. 18 is a flowchart of a parameter priority setting process.

Referring now to the flowchart of FIG. 18, the following will provide details of the parameter priority setting process called at step S3 of FIG. 13. With a given pattern, this process proceeds as follows:

At the outset, the parameter priority setting process extracts the name of every parameter given as constraints in the user-specified pattern (step S51). The process then removes combinations of parameter values and verification scenarios that violate the given constraints (step S52), thus narrowing down the subject of prioritization. As mentioned earlier, the constraints specified in a message sequence chart may conflict with the constraints specified as parameter values when their logical product is evaluated. The parameter priority setting process removes such combinations of parameter values and verification scenarios including such a conflicting message sequence chart.

Now that the names of parameters have been extracted, and verification scenarios for testing user-specified processing scenarios have undergone the above screening process, the process produces combinations of specified values of those extracted parameters and their priority scores (step S53). More specifically, the process extracts a maximum value, minimum value, ideal value, boundary value, and the like from the parameter information corresponding to an extracted parameter name. If no ideal value is defined in the parameter information, a median value may be extracted instead of the ideal value. Those values are used together with the foregoing priority rules to determine a priority score of a specified parameter value.

In the case where there are two or more priority rules applicable to the same parameter value, the process chooses one of those rules that gives a greater priority score than others. Suppose, for example, that a maximum value of 63 is specified as a parameter value. This value is also a boundary value. The priority rule for maximum values gives a priority score of 10, whereas that for boundary values gives a priority score of 4. Accordingly, the parameter priority setting process chooses the former value, 10, as a priority score and thus terminates itself.

The above-described embodiment is configured to remove verification scenarios violating constraints (step S52) before assigning priority scores (step S53) to parameters whose names are extracted (step S51). The embodiment is not limited by this configuration, but may be modified to, for example, execute the tasks of step S52 after step S53.

(g) Example of Labeling Process

Figure 19:
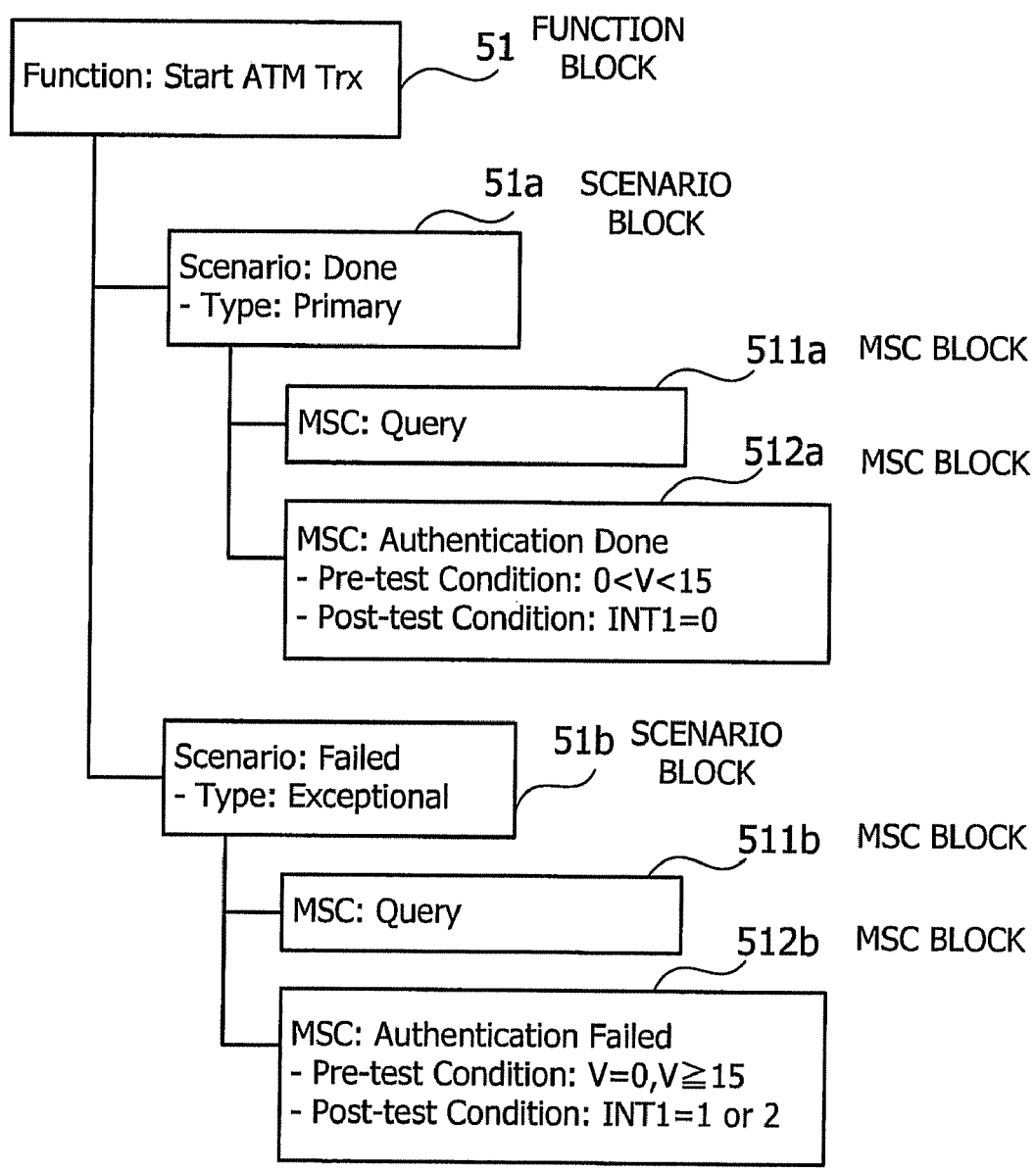
FIG. 19 illustrates an example data structure of an LSI design specification.

This section describes a specific example of labeling, with reference to a data structure of a specific LSI design specification illustrated in FIG. 19. The illustrated LSI design specification 20 describes a function related to transactions on an automatic teller machine (ATM). This example design specification provides a simplified description of authentication of prospect ATM users through the use of their ATM cards and personal identification numbers (PINs).

Specifically, the LSI design specification 20 of FIG. 19 includes a function block 51 that includes two scenarios describing functions for starting an ATM transaction. The first scenario relates to the function of the function block 51, a processing scenario represented by a scenario block 51*a*, and a path for starting and driving a verification scenario to implement the processing scenario of the scenario block 51*a*. This first scenario will be implemented by using message sequence charts corresponding to two MSC blocks 511*a* and 512*a*. The MSC block 512*a* is associated with a message sequence chart including "0<V<15" as a pre-test condition and "INT1=0" as a post-test condition. The first scenario is also associated with an ATM that is supposed to receive PIN from a prospect user.

The second scenario relates to the function of the function block 51, a processing scenario represented by a scenario block 51*b*, and a path for starting and driving a verification scenario to implement the processing scenario of the scenario block 51*b*. This second scenario will be implemented by using message sequence charts corresponding to two MSC blocks 511*b* and 512*b*. The MSC block 512*b* is associated with a message sequence chart including "V=0, V≧15" as a pre-test condition and "INT1=1 or 2" as a post-test condition. The second scenario is also associated with an ATM that rejects PIN from prospect users. The following description will refer to the first scenario as scenario "Done" and the second scenario as scenario "Failed."

Figure 20A:
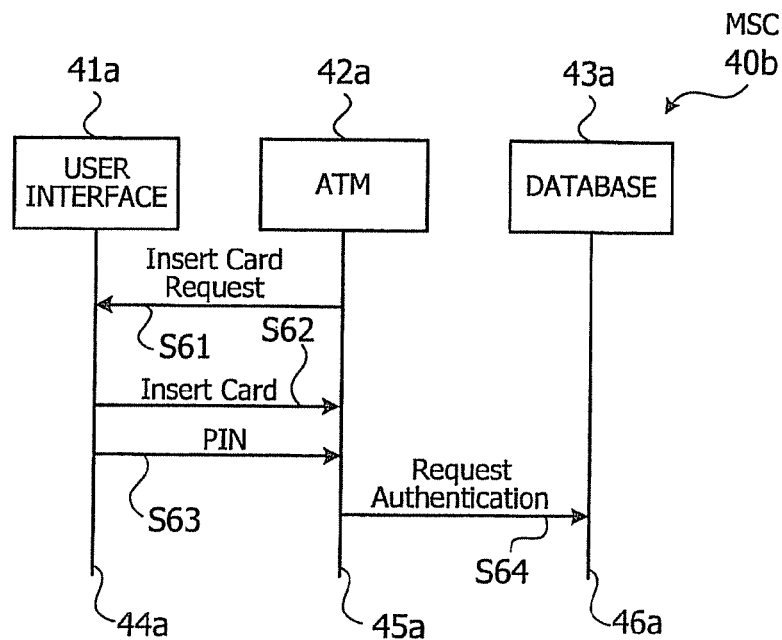
FIGS. 20A to 20C illustrate specific examples of message sequence charts.
Figure 20B:
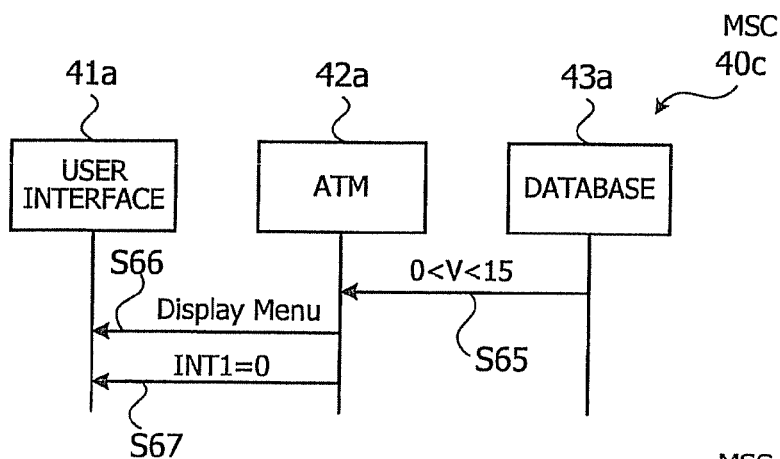
Figure 20C:
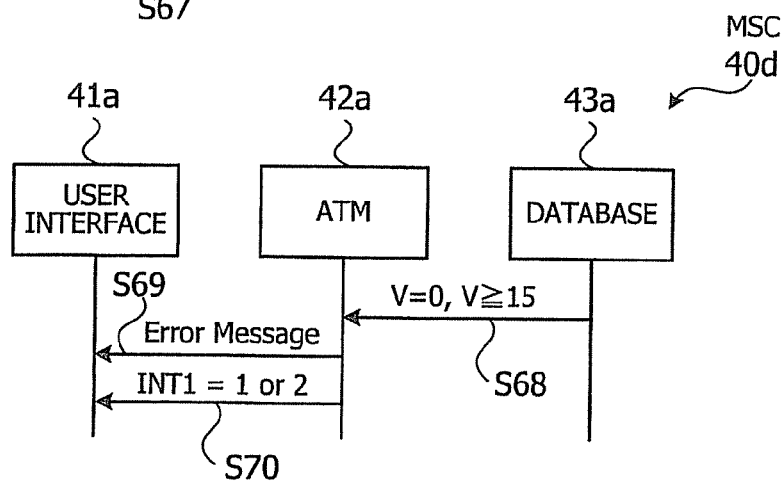

FIGS. 20A to 20C illustrate specific examples of message sequence charts corresponding to different verification scenarios. FIG. 20A depicts a message sequence chart 40*b* corresponding to the MSC block 511*a*. As the MSC block 511*a* is identified by its identifier "Query," the message sequence chart 40*b* is also referred to by the name of "Query." Objects involved are a user interface 41*a*, an ATM 42*a*, and a database 43*a*. These objects have their respective object lines, i.e., user interface line 44*a*, ATM line 45*a*, and database line 46*a*.

Based on the foregoing rules, the message sequence chart 40*b* gives the following process: At the outset, the ATM 42*a* transmits a card insertion request message (Insert_Card) to the user interface 41*a* (step S61). Upon receipt of this message, the user interface 41*a* sends a card insertion indication message (Card_Inserted) back to the ATM 42*a* (step S62). The user interface 41*a* subsequently transmits an entered password (PIN) to the ATM 42*a* (step S63). Upon receipt of the password, the ATM 42*a* transmits an authentication request (PIN_verify) message to the database 43*a* (step S64).

FIG. 20B depicts a message sequence chart 40*c* corresponding to another MSC block 512*a*. As the MSC block 512*a* is identified by its identifier "Authentication Done," this message sequence chart 40*c* is also referred to by the name of "Authentication Done." The message sequence chart 40*c* involves the objects of user interface 41*a*, ATM 42*a*, and database 43*a*, as in the foregoing message sequence chart 40*b*.

Based on the foregoing rules, the message sequence chart 40*c* gives the following process: The database 43*a* sends "0<V<15" to the ATM 42*a* (step S65). Upon receipt of this user data, the ATM 42*a* send a display menu message to the user interface 41*a* (step S66). The ATM 42*a* also sends "INT1=0" to the user interface 41*a* (step S67).

FIG. 20C depicts a message sequence chart 40*d* corresponding to yet another MSC block 512*b*. As the MSC block 512*b* is identified by its identifier "Authentication Failed," this message sequence chart 40*d* is also referred to by the name of "Authentication Failed." The message sequence chart 40*d* involves the objects of user interface 41*a*, ATM 42*a*, and database 43*a*, as in the foregoing message sequence charts 40*b* and 40*c*.

Based on the foregoing rules, the message sequence chart 40*d* gives the following process: The database 43*a* sends "V=0, V≧15" to the ATM 42*a* (step S68). Upon receipt of this error, the ATM 42*a* sends an error message to the user interface 41*a* (step S69). 11 The ATM 42*a* also sends "INT1=1 or 2" to the user interface 41*a* (step S70).

FIGS. 21 to 23 give an example process of labeling an LSI design specification. The labeling process first consults the LSI design specification 20 and selects a function named "Start ATM Transaction" (shortened as "Start ATM Trx" where appropriate) of the function block 51. Out of the selected function, the process then selects scenario "Done" of the scenario block 51*a*. The process now selects "Query," one of the two message sequence charts associated with the selected scenario, and adds a label to the selected message sequence chart "Query."

As described earlier, labels are supposed to include the names of currently selected function and scenario in the form of "function name; scenario name: scenario type." Accordingly, in the example of FIG. 21, the message sequence chart "Query" is added a label 511*a*1, which reads: "Start ATM Trx; Done: Primary." This is what is seen in FIG. 21.

The process then examines the present scenario block 51*a* to determine whether there is any unselected message sequence chart. The process thus discovers and selects an unselected message sequence chart "Authentication Done." Accordingly, the process adds a label 512*a*1 of "Start ATM Trx; Done: Primary" to the selected message sequence chart "Authentication Done."

The process determines again whether there is any unselected message sequence chart in the scenario block 51*a*. As this test returns a negative result, the process then goes back to the function block 51 to see whether there is any unselected scenario. The process thus discovers and selects an unselected scenario "Failed" of scenario block 51*b*.

The process now selects "Query," one of the two message sequence charts associated with the selected scenario "Failed," and adds a label to the selected message sequence chart "Query." Since message sequence chart "Query" has an existing label 511*a*1, the labeling process updates that label 511*a*1 with an additional line of "Start ATM Trx; Failed: Exceptional." FIG. 22 depicts processing results up to this point.

The process then examines the present scenario to determine whether there is any unselected message sequence chart. The process discovers and selects an unselected message sequence chart "Authentication Failed" and thus adds a label 512*b*1 which reads: "Start ATM Trx; Failed: Exceptional."

The process determines again whether there is any unselected message sequence chart in the scenario block 51*b*. As this test returns a negative result, the process then goes back to the function block 51 to see whether there is any unselected scenario. Since there is no more scenario, the process terminates itself. FIG. 23 depicts processing results up to this point.

FIG. 24 illustrates an example data structure of a labeled LSI design specification. The illustrated data describes a labeled version of the LSI design specification 20 in the XML format. This data 60 is formed from three parts of descriptions 61, 62, and 63. The first description 61 describes a message sequence chart 40*b* (FIG. 20A). The second description 62 describes another message sequence chart 40*c* (FIG. 20B). The third description 63 describes yet another message sequence chart 40*d* (FIG. 20C).

Those descriptions 61, 62, and 63 include new lines 61a, 62a, and 63a, respectively, which have been added by the foregoing labeling process, as indicated by the XML tag <label name>. The contents of each tag derive from the corresponding labels added to the finite state machine. These labels may contain the name of a message sequence chart, in addition to what is given in the form of "function name; scenario name: scenario type." This additional label value permits the user to specify a priority pattern for scenarios by using MSC names.

FIG. 25 gives another example of a labeled LSI design specification. Specifically, the illustrated labels 511a1, 512a1, and 512b1 contain the name of a corresponding message sequence chart in addition to the function name, scenario name, and scenario type.

Referring now to the message sequence chart of FIG. 26, the following will provide details of step S14 (FIG. 14). As mentioned earlier, step S14 converts a message sequence chart into a finite state machine. FIG. 26 is a message sequence chart illustrating such a conversion process. To turn a directed graph into a finite state machine, the process of step S14 determines each state of the finite state machine by using events defined in each message sequence chart that the directed graph provides. Here, a message sequence chart defines the order of possible events, and each completed event of an object corresponds to a state of the finite state machine. The initial state, for example, corresponds to an event that is never completed in any objects. The final state corresponds to all events that have been completed in the objects.

Each part of the message sequence chart 70 will be reflected in the target finite state machine through a collection of events that occur to a part of the objects. The objects illustrated in FIG. 26 are: a transmitting object 71, a remote transmitting object 72, a receiving object 73, and a remote receiving object 74. For example, one finite state machine is generated from the transmitting object 71 and receiving object 73. As can be seen in FIG. 26, the transmitting object 71 has five transmit events t1 to t5, while the receiving object 73 has six receive events r1 to r6. Here the transmitting object 71 is associated with the receiving object 73 by two synchronization edges (synch), without actually exchanging messages.

FIG. 27 illustrates a state matrix corresponding to the message sequence chart of FIG. 26. This state matrix 80 will be used to further explain how to generate a finite state machine. For illustrative purposes, suppose that there are only two objects 71 and 73 in the message sequence chart 70. The finite state machine can then be visualized as a two-dimensional state matrix 80. Each block of this state matrix 80 represents a state in which the transmitting object 71 has completed a specific transmit event ti and the receiving object 73 has completed a specific receive event rj. In other words, block (i, j) represents state (ti, rj).

The state matrix 80 has its origin at the top-left corner, and the inverted-T symbol "⊥" is used to indicate an initial state. As the initial state is located at the top-left corner of the state matrix 80, state transitions take place in the direction toward the bottom-right corner representing the final state.

If the transmitting object 71 and receiving object 73 had no synchronization edges between them, their state matrix 80 would be a fully-populated (n×m) state matrix, where n is the number of messages transmitted from the transmitting object 71, and m is the number of messages received by the receiving object 73. The presence of synchronization edges in the message sequence chart 70, however, reduces the number of effective states in the corresponding state matrix 80. That is, a synchronization edge nullifies some states in the state matrix 80, and it is possible to cross out such ineffective states.

Transmit event t3, for example, corresponds to a synchronization edge extending from the transmitting object 71 to the receiving object 73. Reception event r3 is associated with that synchronization edge in this case. Every event occurring in the receiving object 73 after the receive event r2 should not precede the transmit event t3. Accordingly, receive events r3 to r6 are not allowed to happen before the transmit event t3. Based on this fact of the objects 71 and 73, the generation process crosses out an ineffective area 81 of the state matrix 80. Another ineffective area 82 corresponding to the second synchronization edge is crossed out similarly.

The remaining areas of the state matrix 80 represent exactly the message sequence chart 70. For example, state t2 refers to a state of the transmitting object 71 when it has finished transmit event t2. State r1 refers to a state of the receiving object 73 when it has finished receive event r1.

FIG. 28 is a state diagram corresponding to a state matrix. State 91 is one of the states in the illustrated state diagram 90. This state 91 corresponds to one block of the state matrix 80 discussed in FIG. 27. A value of state is indicated in each symbol of state (i.e., circles in FIG. 28). In the illustrated state diagram 90, a state transition in the horizontal direction corresponds to reception of a message. This is implemented in a finite state machine as transmission of a message. Likewise, a state transition in the vertical direction corresponds to transmission of a message. This is implemented in a finite state machine as a state awaiting a message.

When it is possible to move from the current state (i, j) to a new state in either of the horizontal and vertical directions, a horizontal transition is fired by transmitting an appropriate message. This is attempted depending on whether a message invoking a vertical direction is subsequently received. If that test result is positive, a vertical transition may also take place, in which case the next state will be (i+1, j+1). If the test result is negative, the transition will only happen in the horizontal direction, from (i, j) to (i+1, j).

A timer is employed for an object awaiting a message in order not to let the object wait for the expected message endlessly. The timer terminates the waiting state upon expiration of an appropriate time. Some states may allow either a vertical transition or a horizontal transition, but not both. For such states, the finite state machine only implements their applicable transitions.

As can be seen from the above, the direction of transition is one parameter that affects generation of finite state machines. Another such parameter is a particular type of events related to the state. Take the transmitting object 71 and receiving object 73 in FIG. 26, for example. The transmitting object 71 has several events on its object line, each of which falls in one of the following three categories: message transmit events, timer start events, and timeout signal receive events.

Similarly, the receiving object 73 has several events which fall in one of the following three categories: message receive events, timer start events, and timeout signal receive events. These variations of event types in each object lead to nine possible combinations of states which should be considered when generating a finite state machine, since the code produced for each node of the machine depends on exact combinations of such states.

With the above-described techniques, finite state machines are generated from given message sequence charts. Specifically, to produce finite state machines corresponding to different scenarios, the generation process traces a specified path of each scenario and generates a finite state machine for each message sequence chart encountered on the path. The final state of one message sequence chart is linked to the first state of the next message sequence chart on the path. If necessary, the resulting finite state machines may be combined into a single machine.

Finite state machines can be generated and edited automatically by combining signals and variable declarations. The resulting finite state machines can then be used to simulate the operation of the device 300 under test.

Referring now to FIG. 29, the following description will discuss a specific example of how the process of step S15 adds labels to a finite state machine.

Using the foregoing method, the process produces a finite state machine with states corresponding to data event messages in a given message sequence chart. Each machine state is then labeled with the labels of that source message sequence chart. In the present example, four machine states St1, St2, St3, and St4 have been produced from a message sequence chart "Query" as can be seen in FIG. 29. This message sequence chart "Query" bears the following two labels:

"Start ATM Trx; Done: Primary"
"Start ATM Trx; Failed: Exceptional"

Accordingly, every state St1, St2, St3, and St4 of the finite state machine is equally given these labels.

FIG. 30 depicts a final view of the labeled finite state machine. The finite state machine now has states St5 and St6, which have been produced from another message sequence chart "Authentication Done." Since the original message sequence chart "Authentication Done" has a label of "Start ATM Trx; Failed: Exceptional," each state St5 and St6 has that same label.

The finite state machine of FIG. 30 has also gained additional states St7 and St8 from yet another message sequence chart "Authentication Failed." Since the original message sequence chart "Authentication Done" has a label of "Start ATM Trx; Failed: Exceptional," each state St7 and St8 has that same label.

Referring now to FIG. 31, the following description will discuss a specific example of how the process of step S18 crops the finite state machine according to constraints of a given message sequence chart.

FIG. 31 is a state diagram corresponding to a state matrix. Synchronization events may be removed from the state diagram 90 (FIG. 28) since they are only used to partly limit the order of actual operation events according to some constraint of other devices or external entities. Removal of such synchronization events yields a simplified state diagram 92 as depicted in FIG. 31.

FIG. 32 illustrates an example data structure of a finite state machine. The illustrated data 110 describes a finite state machine in the XML format, which is formed from a plurality of descriptions 110a and 111 to 119. Description 110a gives an identifier of the finite state machine 90a (FIG. 30) in a finite state machine tag <fsn name> indicating that what is described in the data 110 is a finite state machine. Descriptions 111 to 118 correspond to states St1 to St8, respectively, where the contents of each tag derive from the corresponding labels added to the finite state machine. Description 119 describes transitions between those states St1 to St8.

Referring to the LSI design specification 20 of FIG. 19 and the labeled finite state machine 90a of FIG. 30, the following description will provide a specific example of how a verification scenario is generated from each processing scenario.

The generation process first consults the design specification of FIG. 19 and selects a function "Start ATM Trx" of the function block 51. The process further selects a scenario "Done" out of the selected function and extracts a finite state machine that contains "Done" in its labels. Specifically, the finite state machine 90a illustrated in FIG. 30 is extracted.

The process further extracts a portion of the finite state machine that bears the same label as the selected scenario. As can be seen from FIG. 30, the selected scenario "Done" has a label of "Start ATM Trx; Done: Primary." Accordingly, the process extracts a collection of states St1 to St6 from the finite state machine. The extracted partial finite state machine is then saved in the verification scenario database 12 as a verification scenario for the purpose of testing the selected processing scenario "Done" of the design specification.

The process now determines whether there is any other scenario in the selected function, thus finding another scenario "Failed." Accordingly, the process selects that scenario "Failed" from the selected function "Start ATM Trx" and extracts a finite state machine that contains "Failed" in its labels. Specifically, the finite state machine 90a illustrated in FIG. 30 is extracted.

The process further extracts a portion of the finite state machine that bears the same label as the selected scenario. As can be seen from FIG. 30, the selected scenario "Failed" has a label of "Start ATM Trx; Failed: Exceptional." Accordingly, the process extracts a collection of states St1, St2, St3, St4, St7, and St8 from the finite state machine. The extracted partial finite state machine is then saved in the verification scenario database 12 as a verification scenario for the purpose of testing the selected processing scenario "Failed" of the design specification.

The process determines again whether there is any other scenario in the selected function, only to find no unselected scenarios. The process also determines whether there is any other function in the design specification, only to find no unselected functions. The process thus terminates itself.

FIG. 33 illustrates verification scenarios stored in the verification scenario database 12. As can be seen in FIG. 33, there are two verification scenarios: Sc1 for testing a processing scenario "Done" and Sc2 for testing another processing scenario "Failed."

The next section will provide more details of verification scenario generation, with a focus on how the process of step S24 produces a verification scenario from a given finite state machine.

(h) Verification Scenario Generation

As described above, verification scenarios are produced from partial finite state machines. While it was relatively easy in the foregoing examples, that is not always the case. For example, the verification scenario generator 11 may actually encounter a finite state machine containing a loop of states. In such cases, the verification scenario generator 11 may need to cut or divide a given partial finite state machine into several units in order to generate verification scenarios.

For example, a partial finite state machine may be cut into small units according to the presence of a state that appears in more than one path. Or alternatively, or in addition to that, a plurality of verification scenarios may be produced according to the constraint that at least a minimum number of, or at most a maximum number of states be present in each verification scenario.

Suppose, for example, that the following partial finite state machine has been extracted from the original machine:

St2→St4→St6→St7→St2→St3→St6→St7→St2→St3→St5→St7→St2→St3→St5→St2.

One logic for dividing such a partial finite state machine is to cut the loop at a state that appears repetitively. In the present case, state St2 is where this long partial finite state machine will be cut into four verification scenarios as follows:

(1) St2→St4→St6→St
(2) St2→St3→St6→St7

(3) St2→St3→St5→St7

(4) St2→St3→St5→St2

To produce a longer verification scenario, the verification scenario generator 11 is allowed to enforce a requirement that at least five state be included in each verification scenario, in addition to the use of St2 as a cutting point. These constraints result in the following two verification scenarios:

(5) St2→St4→St6→St7→St2→St3→St6→St7

(6) St2→St3→St5→St7→St2→St3→St5→St2

The verification scenarios generated in the above-described method are then subjected to a scenario priority setting process as will be described below.

At the outset, the scenario priority setting process initializes parameter i to one. Then out of the items available in the given pattern, the process selects an item with the lowest priority. Here the given pattern specifies "Primary>Exceptional" meaning that primary operation be selected in preference to exceptional operation. Accordingly, the process selects "Exceptional" because of its low priority position.

The process consults the verification scenario database 12 to collect existing verification scenarios that have a label of "Exceptional" in every state. In the present example, verification scenario Sc2 is collected because Sc2 contains "Exceptional" in all states as can be seen from FIG. 33. The collected verification scenario Sc2 is given a priority score of 1 according to the current value of parameter i. Parameter i is then incremented to 2.

The process determines whether there is any other priority item in the given pattern, and thus finds the item "Primary" whose priority is next to the lowest. Accordingly, the process consults the verification scenario database 12 again to collect existing verification scenarios that have a label of "Primary" in every state. In the present example, verification scenario Sc1 is collected because Sc1 contains "Primary" in all states as can be seen from FIG. 33. The collected verification scenario Sc1 is given a priority score of 2 according to the current value of parameter i. Parameter i is then incremented to 3, but the process terminates itself since no unselected priority item remains in the given pattern.

FIGS. 34 and 35 illustrate a data structure of prioritized verification scenarios. Specifically, FIG. 34 illustrates verification scenario Sc1. Line 3 of this verification scenario Sc1 reads: <fsm name="Start ATM Trx FSM" type="scenario" priority="2">. The second attribute type="scenario" indicates that this document describes a verification scenario. The third attribute priority="2" indicates that this verification scenario Sc1 has a priority score of 2.

FIG. 35 illustrates verification scenario Sc2. Line 3 of this verification scenario Sc2 reads: <fsm name="Start ATM Trx FSM" type="scenario" priority="1">. The second attribute type="scenario" indicates that this document describes a verification scenario. The third attribute priority="1" indicates that this verification scenario Sc2 has a priority score of 1.

Referring to the register block 25a and port block 26a of FIG. 11, together with the above verification scenarios Sc1 and Sc2, the following description will provide a specific example of how the parameters are prioritized.

FIGS. 36 and 37 illustrate an example of a parameter priority setting process. It is assumed that the specified pattern include processing scenarios "Done" and "Failed" as its constituent items. The processing scenario "Done" specifies parameter values "V=14" as a pre-test condition and "INT1=0" as a post-test condition. The foregoing verification scenario generation process has produced a verification scenario Sc1 to verify the processing scenario "Done." FIG. 36 thus depicts an MSC block 513a under the scenario block 51a1, which describes a verification scenario "Query, Authentication Done" representing the above-described verification scenario Sc1.

Another scenario block 51b1 represents a scenario "Failed" having parameter values "V=137" and "INT1=2" as its pre-test condition and post-test condition, respectively. The verification scenario generation process has produced a verification scenario Sc2 to verify the processing scenario "Failed." FIG. 36 thus depicts an MSC block 513b under the scenario block 51b1, which describes a verification scenario "Query, Authentication Failed" representing the verification scenario Sc2.

Yet another scenario block 51b2 represents a scenario "Failed" having parameter values "V=0" and "INT1=2" as its pre-test condition and post-test condition, respectively. This scenario block 51b2 is similar to the above scenario block 51b1, but they are different in their pre-test conditions. (There may be another case where two scenario blocks have different post-test conditions.) The verification scenario generation process has produced a verification scenario Sc2 to verify the processing scenario "Failed." FIG. 36 thus depicts an MSC block 513b under the scenario block 51b2, which describes a verification scenario "Query, Authentication Failed" representing the verification scenario Sc2.

Referring to the above scenario blocks, the parameter priority setting process first extracts parameter names specified in those constraints. In the present example, the process extracts a register name "V" and a port name "INT1" from the given constraints. The process then enumerates combinations of parameter values of register "V" and port "INT1" and their respective priority scores. In the present example, the constraints include "V=14," "V=137," and "V=0" as parameter values of register "V," and "INT1=0," "INT1=2," and "INT1=2" as parameter values of port "INT."

The parameter priority setting process then removes verification scenarios conflicting with the constraints. As noted above, scenario "Done" has been given "0<V<15" as a pre-test condition and "INT1=0" as a post-test condition. The logical product of "V=14" and "0<V<15" is "V=14" while that of "INT1=0" and "INT1=0" is "INT1=0." This means that the scenario "Done" satisfies the specified constraints. Accordingly, the parameter priority setting process does not remove the combination of parameters and verification scenario Sc1.

Scenario "Failed," on the other hand, has been given "V=0, V≧15" as a pre-test condition and "INT1=1 or 2" as a post-test condition. The logical product of "V=137" and "V=0, V≧15" is "V=137" while that of "INT1=2" and "INT1=1 or 2" is "INT1=2." This means that the scenario "Failed" with V=137 and INT1=2 satisfies the specified constraints. Accordingly, the parameter priority setting process does not remove the combination of parameters and verification scenario Sc2.

The logical product of "V=0" and "V=0, V≧15" is "V=0" while that of "INT1=2" and "INT1=1 or 2" is "INT1=2." This means that the scenario "Failed" with V=0 and INT1=2 also satisfies the specified constraints. Accordingly, the parameter priority setting process does not remove the combination of parameters and verification scenario Sc2.

The parameter priority setting process then consults the register block 25a (FIG. 11) containing information about register V. The register block 25a indicates that the parameter value "V=14" matches with the ideal value of register V. Accordingly, this parameter value is given a priority score of 1. Likewise, the parameter value "V=137" is found to be the maximum value of register V, and thus given a priority score of 10. The register block 25*a* (FIG. 11) also indicates that the given parameter value "V=0" matches with the minimum value of register V. A priority score of 10 is therefore assigned to this parameter value "V=0."

The parameter priority setting process also consults a port block 26*a* (FIG. 11) containing information about port INT1. The port block 26*a* (FIG. 11) indicates that the parameter value "INT1=0" matches with the minimum value of port INT1. Accordingly, this parameter value is given a priority score of 10. While not indicated in the port block 26*a*, it is assumed here that the parameter value "INT1=2" matches with one of the values relating to past design bugs. A priority score of 7 is thus assigned to the parameter value "INT1=2" in this case.

FIG. 37 depicts what have been obtained up to this point. That is, the scenario blocks now contain a priority score on the right of their parameter values. Also depicted in FIG. 37 are priority scores of verification scenarios. That is, each box representing a verification scenario contains a priority score at the right-hand end.

The above scenarios are then subjected to a priority resolving process. Referring first to the scenario "Done" having parameter values "V=14" and "INT1=0" as pre-test and post-test conditions, its corresponding verification scenario Sc1 has been assigned a priority of 2 according to a user input, and the user-specified pre-test condition parameter V=14 and post-test condition parameter INT1=0 have respectively been assigned priority scores of 1 and 10. These priority scores add up to an overall priority score of 13.

Referring next to another scenario "Failed" having parameter values "V=137" and "INT1=2" as pre-test and post-test conditions, its corresponding verification scenario Sc2 has been assigned a priority score of 1 according to a user input, and the user-specified pre-test condition parameter V=137 and post-test condition parameter INT1=2 have respectively been assigned priority scores of 10 and 7. These priority scores add up to an overall priority score of 18.

Referring to yet another scenario "Failed" having parameter values "V=0" and "INT1=2" as pre-test and post-test conditions, its corresponding verification scenario Sc2 has been assigned a priority of 1 according to a user input, and the user-specified pre-test condition parameter V=0 and post-test condition parameter INT1=2 have respectively been assigned priority factors of 10 and 7. These priority scores add up to a priority score of 18.

A priority ranking list is compiled from scenario names and other associated information as follows. FIG. 38 illustrates an example of such a priority ranking list. This priority ranking list 19*a* has the following data fields arranged in a horizontal direction: "Priority Ranking," "Scenario," "Verification Scenario," "Parameter Name," "Parameter Value," and "Overall Priority Score." These field values in a row are associated with each other, thus constituting a single record.

The priority ranking field contains a value that indicates the priority of a scenario. The value "1" means the highest priority position, which is followed by "2," "3," and so on in descending order of priority. The scenario field contains the name of a processing scenario that the user has specified as a pattern item. The verification scenario field gives an identifier that indicates which verification scenario will be used to verify the specified processing scenario. The parameter name field and parameter value field respectively enumerate the names and values of constraint parameters that the user has specified as pattern items. The overall priority score field contains an overall priority score calculated by the verification order resolver 18. This priority ranking list 19*a* permits the user to understand the priority ranking of scenarios and parameter values that he/she has specified.

As can be seen from the above description, the proposed design verification apparatus 10 produces a priority ranking list 19*a* from scenarios and parameter values that the user specifies depending on the progress of design or verification of an LSI design specification 20. This feature makes it possible to verify the scenarios and parameter values in an efficient way. That is, by following the priority ranking described in the priority ranking list 19*a*, the user can execute verification without skipping necessary tests or duplicating test items. Specifically, duplicated scenarios are removed through the process of evaluating whether they satisfy a specified set of constraints. This process also outputs every combination of scenarios and parameters that satisfy the constraints, thus avoiding oversight and omission.

For example, the user-specified patterns may include, but not limited to, the following patterns:

(1) In the early stage of verification, it is appropriate to verify primary paths in the first place, in preference to alternative paths and exceptional paths. Accordingly, the following pattern is preferable: "Primary>Alternative>Exceptional"

(2) In the case of a regression test after bug fixing, it is appropriate to give top priority to scenario X where the bug was found and fixed, and then proceed to other scenarios Y referencing directly to the fixed point before testing the remaining scenarios Z. Accordingly, a preferable pattern is in the following form: "scenario X>scenarios Y>scenarios Z"

(3) In the final stage of design, it is often desirable to concentrate on exceptional cases. It is therefore appropriate to test the exceptional path of scenarios in the first place and then proceed to alternative path and primary path. Accordingly, the following pattern is preferable: "Exceptional>Alternative>Primary"

(4) The specification of a target product may sometimes be changed in the middle of its design process. If this is the case, it is appropriate to give priority to the scenarios relating to the modified functions. Accordingly, the pattern preferably specifies such scenarios alone.

According to the above embodiments, the proposed design verification apparatus 10 employs a verification scenario generator 11 to produce verification scenarios for a plurality of processing scenarios defined in a given LSI design specification 20 by assigning appropriate labels to message sequence charts of each processing scenario. This feature makes it possible to identify which message sequence charts constitute a specific scenario.

Also, the verification scenario generator 11 generates a finite state machine from such message sequence charts, where each state of the produced state machine is assigned the label of its corresponding message sequence chart. This feature makes it possible to identify which states constitute a specific scenario.

Furthermore, the verification scenario generator 11 extracts finite state machines corresponding to each processing scenario of the given LSI design specification 20, so that a verification scenario can be produced for each extracted finite state machine. This feature makes it possible to produce verification scenarios according to a pattern that the user specifies depending on the progress of design and verification.

The design verification apparatus 10 also employs a scenario priority setter 13 to prioritize verification scenarios according to a user-specified priority pattern. This scenario priority setter 13 is configured to apply a specific priority score equally to verification scenarios related to the portions specified by a given pattern. It is therefore possible to execute a verification test with required verification scenarios all at the same priority level. In other words, this feature aids the user to verify every necessary scenario without omission.

In addition, the scenario priority setter 13 is configured to use process priority information included in a given pattern when determining a priority score of each verification scenario. This feature provides the user with flexibility in specifying a pattern of process priorities.

While the foregoing embodiments use a logical expression of priorities which involves both verification scenarios and parameters, the invention is not limited by those embodiments. For example, it is also possible to determine the priority ranking of scenarios based only on the priority scores of parameters.

As another variation, the processing functions of the design verification apparatus 10 may be distributed to a plurality of processing devices. For example, one processing device generates verification scenarios and passes them to another device to perform scenario priority setting and subsequent processes. Or alternatively, one processing device may undertake verification scenario generation and scenario priority setting and pass the results to another device for subsequent processing.

The above-described embodiments may also be combined on an individual feature basis.

The above-described processing functions (and methods) may be implemented on a computer system, in which case the functions of the proposed design verification apparatus 10 are encoded and provided in the form of computer programs. A computer system executes such programs to provide the above-described processing functions. Such computer programs may be stored in a computer-readable storage medium. Suitable computer-readable storage media include, but not limited to, magnetic storage devices, optical discs, magneto-optical storage media, and semiconductor memory devices, for example. Magnetic storage devices include hard disk drives (HDD), flexible disks (FD), and magnetic tapes, for example. Optical discs include digital versatile discs (DVD), DVD-RAM, compact disc read-only memory (CD-ROM), CD-Recordable (CD-R), and CD-Rewritable (CD-RW), for example. Magneto-optical storage media include magneto-optical discs (MO), for example.

Portable storage media, such as DVD and CD-ROM, are suitable for distribution of program products. Network-based distribution of software programs may also be possible, in which case several master program files are made available on a server computer for the purpose of downloading to other computers via a network.

To execute a design verification program, the computer stores necessary software components in its local storage device, which have previously been installed from a portable storage media or downloaded from a server computer. The computer executes the programs read out of the local storage unit, thereby performing the programmed functions. Where appropriate, the user computer may execute program codes read out of the portable storage medium, without previous installation of those programs in its local storage device. Another alternative method is that the user computer dynamically downloads programs from a server computer when they are demanded and executes them upon delivery.

CONCLUSION

The above sections have described several embodiments of a design verification apparatus and a program therefor, which provide the user with useful information for the purpose of efficient design verification.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that various changes, substitutions, and alterations could be made hereto without departing from the spirit and scope of the invention.

What is claimed is:

1. A computer-readable, non-transitory medium encoded with a design verification program which, when executed by a computer, causes the computer to perform an operation, the operation comprising:

selecting, in response to a verification request for a procedure described in a design specification of a target product, one or more verification datasets for verifying the procedure;

determining a priority score of each parameter that the selected verification datasets specify as a constraint providing conditions for execution of the procedure, wherein the parameters include those specified as input values for registers or ports defined in the design specification, and wherein a higher priority score is assigned to a parameter associated with the registers or ports than a parameter not associated with any of the registers and ports;

determining a verification order of the selected verification datasets, based on the determined priority scores of the parameters; and producing data identifying the verification datasets, together with indication of the determined verification order.

2. The computer-readable, non-transitory medium according to claim 1, wherein said determining of priority scores evaluates a logical expression involving a given parameter and a constraint to be exerted on unit processes of the procedure and determines the priority score of the given parameter according to the evaluation of the logical expression.

3. The computer-readable, non-transitory medium according to claim 1, the operation further comprising assigning a priority score to each of the verification datasets according to a priority of the procedure, wherein said determining of the verification order relies on both the priority scores of the parameters and the priority scores of the verification datasets.

4. The computer-readable, non-transitory medium according to claim 3, wherein:

the verification datasets associate each unit process of the procedure with an identifier designating which portion of the design specification is to be verified; and said assigning assigns a specific priority score equally to verification datasets that are associated with one of the identifiers.

5. The computer-readable, non-transitory medium according to claim 4, wherein said assigning assigns, to the verification datasets corresponding to a specified identifier, a priority score that is determined from a process priority assigned to the specified identifier.

6. The computer-readable, non-transitory medium according to claim 4, wherein said assigning assigns a priority score that enables verifying a portion of the design specification which is designated by said one of the identifiers, in preference to other portions.

7. The computer-readable, non-transitory medium according to claim 4, the operation further comprising generating the verification datasets.

8. The computer-readable, non-transitory medium according to claim 7, wherein:
the unit processes each comprise a sequence of signals exchanged between objects; and
said generating comprises associating one of the identifiers with each sequence.

9. The computer-readable, non-transitory medium according to claim 8, wherein said generating further comprises producing state machines from the sequences and assigns the identifiers of the corresponding source sequences to states of the produced state machines.

10. The computer-readable, non-transitory medium according to claim 9, wherein:
the identifier designating a portion of the design specification includes information on a function, or a procedure, or a sequence, or a combination thereof, which is offered by said portion; and
said generating further comprises extracting a part of the state machines whose states share a specific identifier, and outputting the extracted partial state machine as a verification dataset.

11. The computer-readable, non-transitory medium according to claim 9, wherein said generating further comprises reducing the number of states of the sequences, based on a specified constraint on the sequences.

12. A method of verifying a design, the method comprising:
selecting, by a computer in response to a verification request for a procedure described in a design specification of a target product, one or more verification datasets for verifying the procedure;
determining, by the computer, a priority score of each parameter that the selected verification datasets specify as a constraint providing conditions for execution of the procedure, wherein the parameters include those specified as input values for registers or ports defined in the design specification, and wherein a higher priority score is assigned to a parameter associated with the registers or ports than a parameter not associated with any of the registers and ports;
determining, by the computer, a verification order of the selected verification datasets, based on the determined priority scores of the parameters; and
producing, by the computer, data identifying the verification datasets, together with indication of the determined verification order.

13. A design verification apparatus comprising:
a priority resolver, responsive to a verification request for a procedure described in a design specification of a target product, to select one or more verification datasets for verifying the procedure and determine a priority score of each parameter that the selected verification datasets specify as a constraint providing conditions for execution of the procedure, wherein the parameters include those specified as input values for registers or ports defined in the design specification, and wherein a higher priority score is assigned to a parameter associated with the registers or ports than a parameter not associated with any of the registers and ports;
a verification order resolver to determine a verification order of the selected verification datasets, based on the priority scores determined by the priority resolver; and
an output processor to produce data identifying the verification datasets, together with indication of the determined verification order.

\* \* \* \* \*

UNITED STATES PATENT AND TRADEMARK OFFICE
CERTIFICATE OF CORRECTION

| | | |
|---|---|---|
| PATENT NO. | : 8,365,112 B2 | Page 1 of 1 |
| APPLICATION NO. | : 12/702576 | |
| DATED | : January 29, 2013 | |
| INVENTOR(S) | : Ryosuke Oishi et al. | |

It is certified that error appears in the above-identified patent and that said Letters Patent is hereby corrected as shown below:

On the Title Page, item (54) and in the Specification, Column 1, Lines 1 and 2, Delete "VERIFICATION APPARATUS AND DESIGN VERIFICATION PROGRAM" and insert -- DESIGN VERIFICATION APPARATUS AND DESIGN VERIFICATION PROGRAM --, therefore.

Signed and Sealed this
Thirtieth Day of April, 2013

Teresa Stanek Rea
*Acting Director of the United States Patent and Trademark Office*